United States Patent [19]
Fleming

[11] Patent Number: 5,867,302
[45] Date of Patent: Feb. 2, 1999

[54] BISTABLE MICROELECTROMECHANICAL ACTUATOR

[75] Inventor: James G. Fleming, Albuquerque, N. Mex.

[73] Assignee: Sandia Corporation, Albuquerque, N. Mex.

[21] Appl. No.: 908,639

[22] Filed: Aug. 7, 1997

[51] Int. Cl.$^6$ .................................................. G02B 26/00
[52] U.S. Cl. ........................ 359/291; 359/295; 359/224; 359/230; 310/328; 348/770
[58] Field of Search ................... 359/290, 291, 359/295, 298, 224, 230, 846, 850; 310/328, 366; 348/770, 771

[56] References Cited

U.S. PATENT DOCUMENTS

| | | | |
|---|---|---|---|
| 4,280,756 | 7/1981 | Albertinetti | 359/295 |
| 4,441,791 | 4/1984 | Hornbeck | 359/295 |
| 5,212,582 | 5/1993 | Nelson | 359/572 |
| 5,285,196 | 2/1994 | Gale, Jr. | 345/108 |
| 5,311,360 | 5/1994 | Bloom | 359/572 |
| 5,382,961 | 1/1995 | Gale, Jr. | 345/108 |
| 5,416,375 | 5/1995 | Funakubo et al. | 310/328 |
| 5,444,566 | 8/1995 | Gale | 359/291 |
| 5,504,026 | 4/1996 | Kung | 437/51 |
| 5,526,951 | 6/1996 | Bailey | 216/24 |
| 5,535,047 | 7/1996 | Hornbeck | 359/295 |
| 5,550,090 | 8/1996 | Ristic | 437/228 |
| 5,579,151 | 11/1996 | Cho | 359/291 |
| 5,583,688 | 12/1996 | Hornbeck | 359/291 |
| 5,600,197 | 2/1997 | Takeuchi et al. | 310/328 |
| 5,608,282 | 3/1997 | Wilber et al. | 310/328 |
| 5,616,982 | 4/1997 | Um et al. | 310/328 |
| 5,629,794 | 5/1997 | Magel | 359/290 |
| 5,629,918 | 5/1997 | Ho | 369/112 |
| 5,631,782 | 5/1997 | Smith | 359/871 |
| 5,640,479 | 6/1997 | Hegg | 385/120 |
| 5,774,252 | 6/1998 | Lin et al. | 359/224 |
| 5,808,781 | 9/1998 | Arney et al. | 359/291 |

OTHER PUBLICATIONS

Roger T. Howe, Bernhard E. Boser and Albert P. Pisano, "Polysilicon Integrated Microsystems: Technologies and Applications," *Sensors and Actuators A*, vol. 56, pp. 167–177 (1996).

*Primary Examiner*—Loha Ben
*Attorney, Agent, or Firm*—John P. Hohimer

[57] ABSTRACT

A bistable microelectromechanical (MEM) actuator is formed on a substrate and includes a stressed membrane of generally rectangular shape that upon release assumes a curvilinear cross-sectional shape due to attachment at a midpoint to a resilient member and at opposing edges to a pair of elongate supports. The stressed membrane can be electrostatically switched between a pair of mechanical states having mirror-image symmetry, with the MEM actuator remaining in a quiescent state after a programming voltage is removed. The bistable MEM actuator according to various embodiments of the present invention can be used to form a nonvolatile memory element, an optical modulator (with a pair of mirrors supported above the membrane and moving in synchronism as the membrane is switched), a switchable mirror (with a single mirror supported above the membrane at the midpoint thereof) and a latching relay (with a pair of contacts that open and close as the membrane is switched). Arrays of bistable MEM actuators can be formed for applications including nonvolatile memories, optical displays and optical computing.

45 Claims, 19 Drawing Sheets

BISTABLE MICROELECTROMECHANICAL ACTUATOR

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to microelectromechanical (MEM) devices, and in particular to a bistable MEM actuator that has applications for forming mechanical nonvolatile memories, optical modulators, switchable mirrors, and latching relays.

BACKGROUND OF THE INVENTION

Semiconductor integrated circuit (IC) technology can be used to form microelectromechanical (MEM) devices, including optical modulators or switchable mirrors (i.e. optical beam deflectors) as disclosed in exemplary U.S. Pat. Nos. 5,212,582; 5,311,360 and 5,579,151. Conventional MEM optical modulators or switchable mirrors rely on stops that limit a range of movement of the mirror to prevent short circuiting of the MEM device. Mechanical contact between the mirrors and the stops, however, can result in stiction due to van der Waals forces or surface contamination. Stiction limits device reliability and requires the use of a reset voltage sequence to allow the mirror to change states. Anti-stiction coatings have also been developed in an attempt to alleviate stiction, but long-term reliability remains a problem whenever two micromachined surfaces come into contact. Thus, there is a need for improved MEM devices that overcome the problem of stiction and thereby provide an increased reliability.

An advantage of the present invention is that a bistable MEM actuator is provided with a moveable membrane shaped to preclude, in some preferred embodiments of the present invention, any contact between the membrane and an underlying substrate electrode or stop, thereby eliminating stiction.

A further advantage of the present invention is that the bistable MEM actuator can be adapted to form many different types of MEM devices, including mechanical memories, optical modulators, optical beam deflectors (i.e. switchable or rotatable mirrors) and latching relays.

Yet another advantage of the present invention is that the bistable MEM actuator remains stable in a quiescent state after the removal of electrical power (i.e. a programming voltage) from the device, thereby simplifying operation of the device, improving device reliability, and providing for nonvolatile operation of the device.

These and other advantages of the apparatus of the present invention will become evident to those skilled in the art.

SUMMARY OF THE INVENTION

The present invention relates to a microelectromechanical (MEM) actuator having a pair of switchable mechanical states, comprising a shaped membrane formed above a substrate, the membrane being formed in compression and further being pinned by elongate supports at a pair of opposing edges thereof and by an elongate resilient member below the membrane at or near a midpoint thereof to provide a curvilinear cross-sectional shape for the membrane that defines a first mechanical state thereof; and electrostatic means, including at least one pair of electrodes and a programming voltage supplied by a signal generator, for switching the membrane from the first mechanical state to a second mechanical state having a cross-sectional shape that is asymmetric with respect to the first mechanical state (i.e. a mirror image of the first mechanical state). In its simplest form, the bistable MEM actuator can be used as a mechanical nonvolatile memory for storing information in digital form.

The MEM actuator can further include one or more mirrors supported on posts above the membrane. In one embodiment of the present invention, a single mirror is provided, centered above the membrane, to form a switchable mirror MEM device for deflecting an incident light beam in a preferred direction, or switching the incident light beam between a pair of angular states. In another embodiment of the present invention, a pair of mirrors are provided above the membrane, with each mirror being located halfway between the resilient member and one of the pinned edges of the membrane, to form an optical modulator wherein the mirrors are synchronously moveable in opposing vertical directions without rotation.

In yet another embodiment of the present invention, the bistable MEM actuator can be used to form a latching relay having at least one pair of relay contacts that are switchable between an open-circuit state and a closed-circuit state in response to an electrostatic actuation of the membrane.

Additional advantages and novel features of the invention will become apparent to those skilled in the art upon examination of the following description, or can be learned by practice of the invention. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

The present invention can best be described by considering a series of examples of a bistable microelectromechanical (MEM) actuator device 10 formed according to the present invention as shown in FIGS. 1–9 and described in detail hereinafter.

EXAMPLE 1

Figure 1:
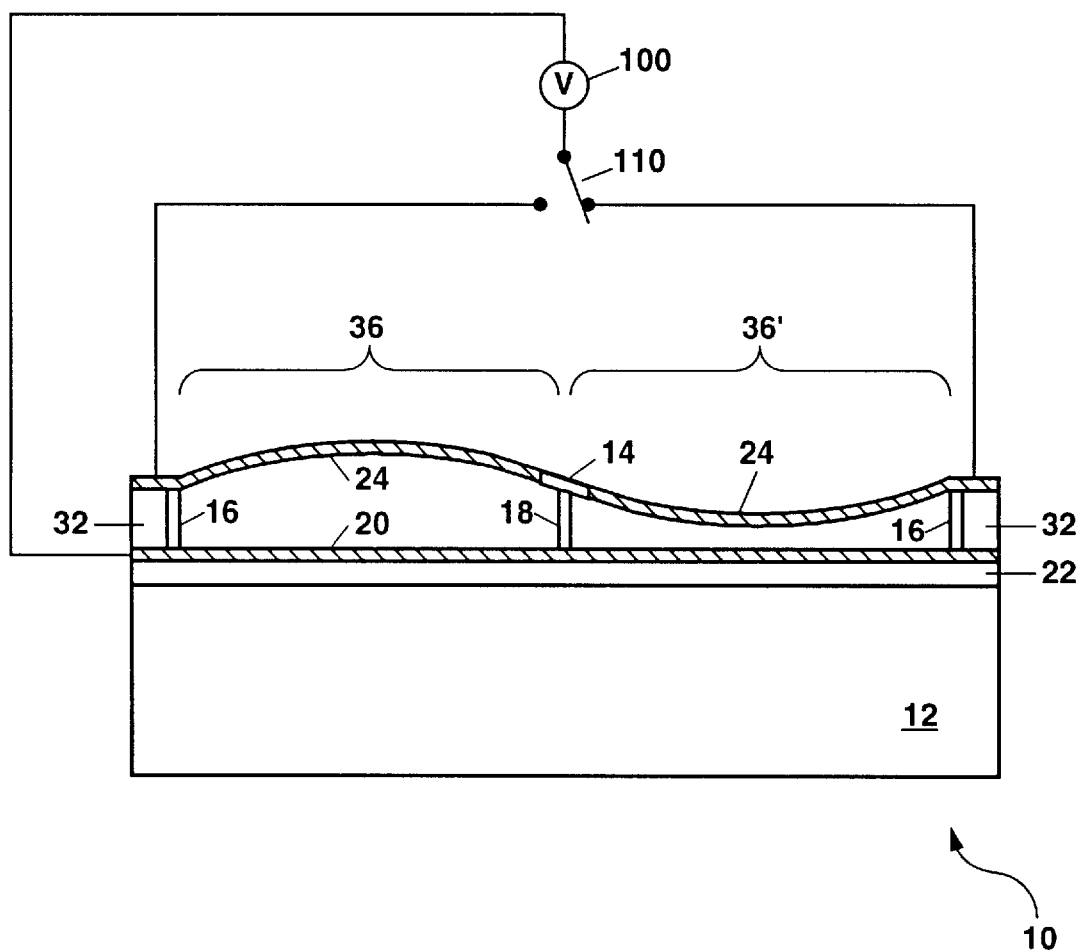
FIG. 1 shows a schematic cross-section view of a first example of a bistable MEM actuator according to the present invention.

Referring to FIG. 1, there is shown a schematic cross-section view of a first example of a bistable MEM actuator device 10 according to the present invention. The first example of the device 10 is useful for forming a nonvolatile mechanical memory in which a logic state is set electrostatically and read out as a change in capacitance. The first example of the device 10 comprises a substrate 12 upon which is formed a shaped membrane 14 that is generally rectangular in plan view with a longitudinal axis extending between a pair of elongate supports 16. The membrane 14 is initially formed as a planar sheet (see FIGS. 2h and 3i) with a predetermined level of internal stress so that upon release the membrane takes on a curvilinear cross-sectional shape (see FIG. 1). The curvilinear cross-sectional shape, which is preferably sinusoidal, is determined by the membrane 14 being restrained due to attachments to the pair of supports 16 located at opposite edges of the membrane 14, and to a resilient elongate member 18 located at or near a midpoint of the membrane 14.

For electrical actuation to select between two stable mechanical states of the bistable MEM actuator 10, at least one pair of addressing electrodes (i.e. electrodes 20 and 24) is required. A lower electrode 20 can be provided on the substrate 12 below the membrane 14 as shown in FIG. 1, or on an insulating layer 22 formed above the substrate 12. An upper electrode 24 can either be located on the membrane 14 (e.g. on a surface of the membrane 14); or else the membrane can be electrically conducting (e.g. doped polysilicon, or a metal or metal alloy) to serve as the other electrode of the pair of addressing electrodes. If a pair of upper electrodes 24 are provided as shown in FIG. 1, then the electrodes 24 are electrically isolated from each other so that they can be individually addressed. Similarly, a pair of lower electrodes 20 can be electrically isolated from each other.

In preferred embodiments of the present invention, one of the electrodes, 20 or 24, is formed as a common electrode extending between the pair of supports 16. In other embodiments of the present invention, two or more pairs of electrodes, 20 and 24, can be provided so that each side of the device 10 can be separately addressed, or so that one or more of the pairs of electrodes, 20 and 24, can be used as sense electrodes to capacitively sense a state of the device 10.

In FIG. 1, the substrate 12 is preferably a semiconductor substrate comprising monocrystalline silicon. A plurality of material layers are deposited or formed on the substrate 12 and are patterned (e.g. by etching or lift-off) to form the various elements of the bistable MEM actuator device 10. If an electrically conducting substrate 12 (e.g. a doped silicon substrate) is used, then an insulating layer 22 (e.g. silicon dioxide or silicon nitride) can be provided above the conducting substrate 12 to isolate the electrode(s) 20 as shown in FIG. 1. The insulating layer 22 can be omitted when the substrate itself is insulating (e.g. for a semi-insulating silicon substrate). In FIGS. 1–9 only a portion of the substrate 12 is shown corresponding to a single device 10, although a plurality of devices 10 will generally be formed on the substrate 12.

FIGS. 2a–2i show a series of process steps that can be used for forming the first example of the bistable MEM actuator device 10 on a surface of a silicon substrate 12.

Figure 2A:
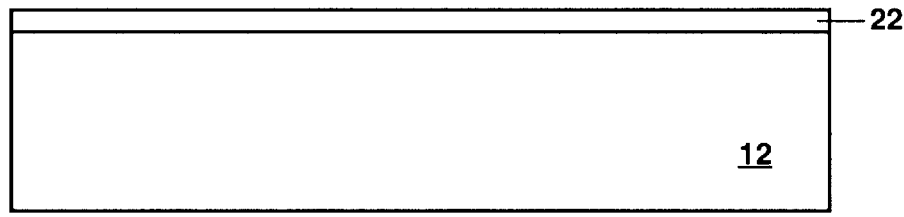
FIGS. 2a–2i show schematic cross-section views of a series of process steps for forming the bistable MEM actuator of FIG. 1 above a substrate.

In FIG. 2a, insulating layer 22 (e.g. silicon nitride and/or silicon dioxide) is preferably blanket deposited above the surface of the silicon substrate 12. The insulating layer 22 can include a thin blanket layer (not shown) of a thermal oxide (e.g. about 60 nanometers of silicon dioxide formed by a thermal diffusion process) provided to protect the surface of the silicon substrate 12. The insulating layer 22 can be about 100–500 nanometers thick, and is preferably formed, at least in part, by a low-pressure chemical vapor deposition (CVD) process. The exact thickness of the insulating layer 22 will depend on a programming voltage of the bistable MEM actuator 10.

Figure 2B:
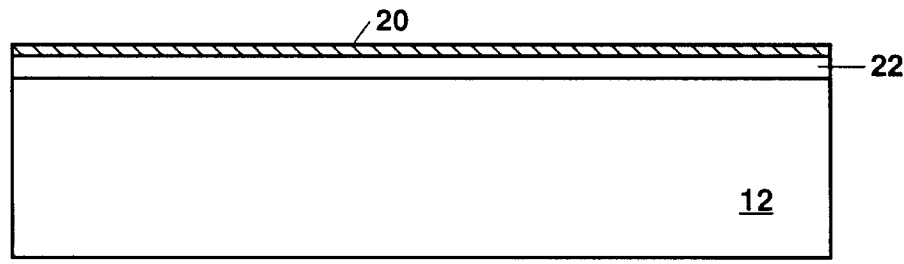

One or more lower electrodes 20 are then preferably deposited (e.g. by sputtering, evaporation or CVD) above the insulating layer 22 as shown in FIG. 2b. Although a single lower electrode 20 is shown in FIG. 2b; in some embodiments of the present invention, a plurality of patterned lower electrodes 20 can be provided with some of the lower electrodes 20 being used to activate the device and switch a mechanical state therein, and other of the lower electrodes being used to capacitively sense the mechanical state of the device 10. The lower electrodes 20 can be formed, for example, from titanium nitride (TiN) or doped silicon. Interconnect wiring (not shown) can also be formed at this time for addressing each lower electrode 20, or for electrically connecting each lower electrode 20 to a bond pad.

Figure 2C:
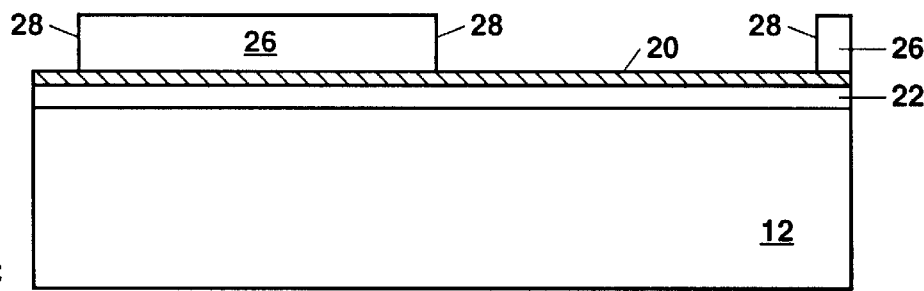

In FIG. 2c, a first sacrificial layer 26 is deposited over the substrate 12 and is patterned by etching to form a plurality of sidewalls 28 whereon material is to be deposited for forming the supports 16 and the resilient member 18. The first sacrificial layer 26 can comprise about 0.5–2 $\mu$m (microns) or more of polycrystalline silicon (also termed polysilicon), silicon dioxide, a silicate glass (e.g. deposited from the decomposition of tetraethylortho silicate, also termed TEOS, that has been densified by heating to a high temperature for a specified period of time), or a polymer. The first sacrificial layer 26 can be grown or deposited by CVD wherein a layer-forming gas is decomposed to form the layer 26; or by plasma-enhanced CVD (also termed PECVD) wherein applied radio-frequency (rf) power is provided to assist the decomposition of the layer-forming gas for deposition at a reduced temperature of about 600° C. or less.

Figure 2D:
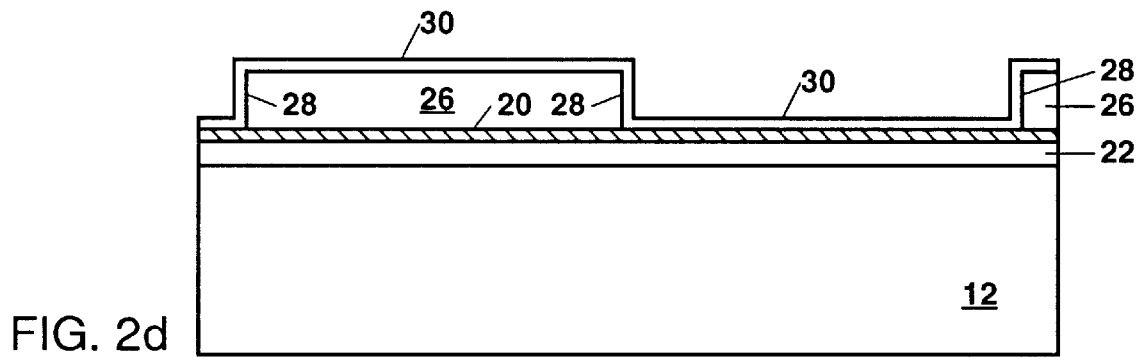

In FIG. 2d, a resilient-member-forming layer 30 comprising silicon dioxide, silicon nitride or polysilicon is blanket deposited over the patterned first sacrificial layer 26 to a thickness of about 50–500 nanometers. The layers 26 and 30 preferably are of different compositions so that the first sacrificial layer 26 can later be removed by a selective etchant that does not substantially attack the supports 16 and resilient member 18 formed from the resilient-member-forming layer 30.

Figure 2E:
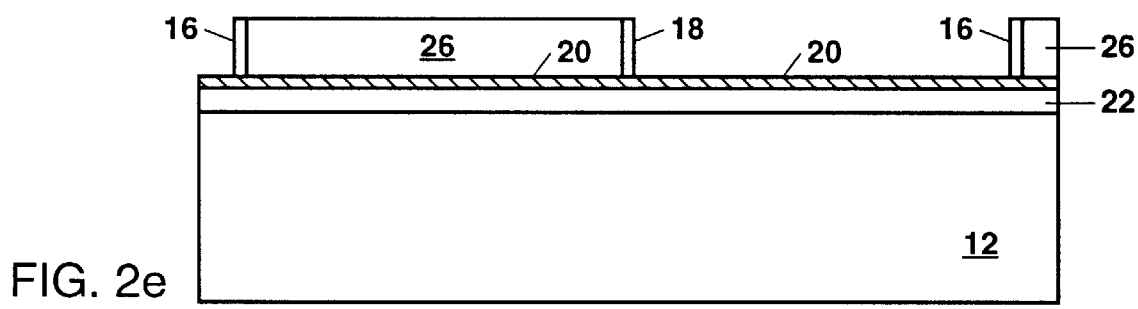

The exact thickness of the resilient-member-forming layer 30 will depend upon the material used to form the layer 30, and a predetermined width (e.g. about 100 nanometers) and resilience for the resilient member 18 to be formed from the layer 30. If the first sacrificial layer 26 comprises silicon dioxide or a silicate glass, then the resilient-member-forming layer 30 can comprise either silicon nitride or polysilicon. Alternately, if the sacrificial layer 26 comprises polysilicon, then the resilient-member-forming layer 30 can comprise silicon dioxide or silicon nitride. In FIG. 2e, the resilient-member-forming layer 30 is anisotropically reactive ion etched (e.g. in a plasma formed from a source gas comprising $XeF_2$, $SF_6$, $Cl_2$ or $CH_3F$ depending on the composition of the layer 30) to leave the resilient-member-forming layer 30 on the sidewalls 28, thereby forming the supports 16 and the resilient member 18. Alternately, the supports 16 and resilient member 18 can be formed by deposition and patterning processes.

Figure 2F:
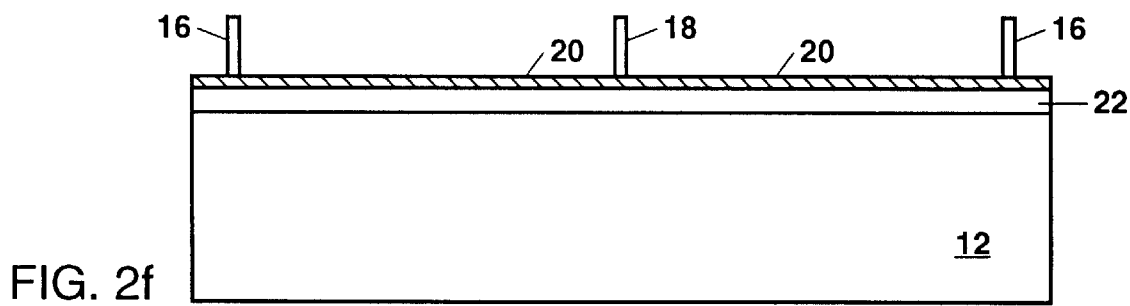
Figure 2G:
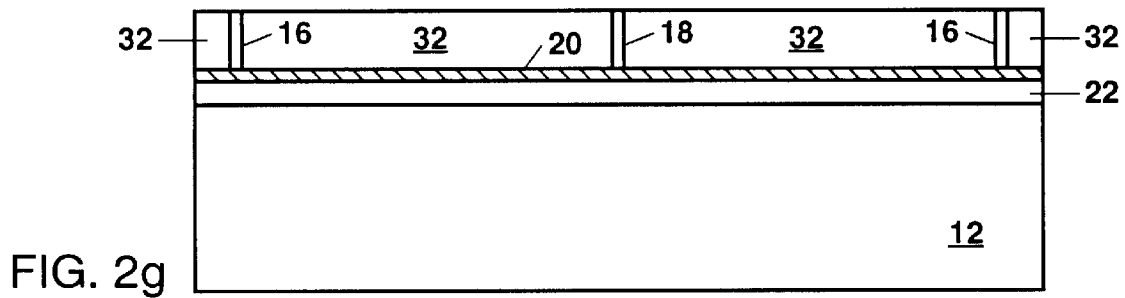

In FIG. 2f, the first sacrificial layer 26 is removed by a selective wet etchant (e.g. comprising tetramethyl ammonium hydroxide, also termed TMAH, for a polysilicon layer 26; or comprising HF for a silicon dioxide or silicate glass layer 26), or alternately a selective dry etchant (e.g. comprising a plasma including $XeF_2$, $SF_6$ or $Cl_2$ for a polysilicon layer 26; or comprising a plasma including $CH_3F$ for a silicon dioxide or silicate glass layer 26). After the selective etching step, the resilient member 18 and the supports 16, which are chemically resistant to the selective etchant, are left standing as shown in FIG. 2f. In FIG. 2g, a second sacrificial layer 32 (e.g. with the same composition as the first sacrificial layer 26) is deposited over the substrate 12 and planarized down to the resilient member 18 and the supports 16 (e.g. by chemical-mechanical polishing or a spin-on planarization step) to provide a smooth upper surface for deposition of the membrane 14.

Figure 2H:
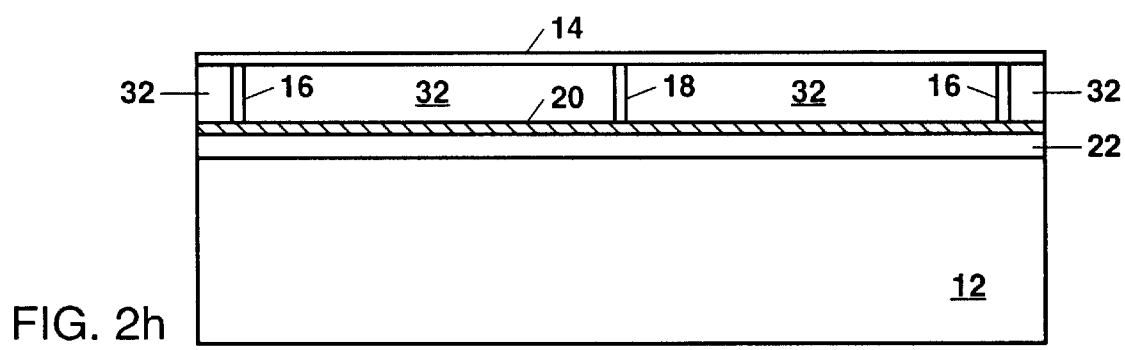

The membrane 14 comprising a thin layer (about 100–500 nanometers thick) of polysilicon, silicon nitride, silicon dioxide, a metal (e.g. aluminum, tungsten, gold, copper, platinum, nickel or palladium) or a metal alloy (including metal suicides) is then deposited or grown to blanket the planarized surface of the substrate 12 and to contact the resilient member 18 and the supports 16 as shown in FIG. 2h. The membrane 14 is then laterally patterned (e.g. by etching) to provide, for example, a rectangular shape in plan view with a width of generally about 1–10 $\mu$m or more, and a length between the supports 16 of up to about 20 times the width. According to some preferred embodiments of the present invention, the same material used for forming the resilient member 18 and elongate supports 16 is used to form the membrane 14.

The material forming the membrane 14 is deposited (e.g. by CVD or LPCVD) or grown (e.g. a thermal oxide) with a predetermined level of compressive stress that depends in part on the deposition conditions (e.g. deposition temperature, deposition rate, and source gases) and in part on the composition of the membrane 14. The compressive stress in the membrane 14 results in the membrane 14 being in one of two minimum energy states (i.e. stable mechanical states) after a subsequent etch release step that removes the underlying second sacrificial layer 32 and leaves the membrane pinned by the supports 16 and the resilient member 18. These stable mechanical states are each characterized by an asymmetrical bowing or curvilinear shape of the membrane 14 with one of the mechanical states being the mirror image of the other mechanical state.

To maintain the predetermined level of compressive stress in the membrane 14, a high-temperature, long-time-duration thermal annealing step that is normally provided for preventing stress in deposited layers (especially polysilicon layers) of microelectromechanical devices is preferably omitted. In some cases, however, the membrane 14 (e.g. a silicon dioxide membrane 14) will be substantially unaffected by the inclusion of a high-temperature (e.g. in the range of 700°–1300° C.), long-time-duration (e.g. up to several hours) thermal annealing process step.

Figure 2I:
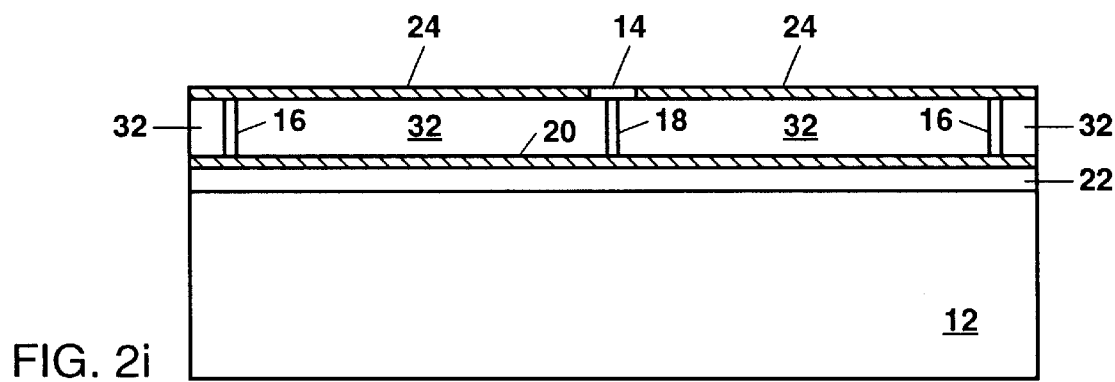

After deposition, a polysilicon membrane 14 can be selectively doped by ion implantation or impurity dopant diffusion through a patterned mask to form individual electrically-isolated upper electrodes 24 superposed above each lower electrode 20 as shown in FIG. 2i. Alternately, metal upper electrodes 24 can be deposited either in an etched recess in the second sacrificial layer 32 prior to deposition of the membrane 14, or above the second sacrificial layer 32. The metal electrodes 24 can be patterned by etching or lift-off. In some embodiments of the present invention, the membrane 14 can be electrically conductive to provide a common upper electrode 24 (e.g. a ground electrode) for the bistable MEM actuator device 10, with a pair of patterned lower electrodes 20 being superposed beneath the common upper electrode 24.

Access regions (not shown) wherein the underlying second sacrificial layer 32 is exposed are preferably provided on one or both sides of the generally rectangular membrane 14 that are not in contact with the supports 16. These access regions allow the second sacrificial layer 32 to be removed between the supports 16 and resilient member 18 during an etch release step. The etch release step uses a selective etchant for contacting the second sacrificial layer 32 and dissolving the layer 32, thereby releasing the membrane 14 for movement. The selective etchant can comprise a buffered oxide etchant (BOE) that includes hydrofluoric acid (HF) in the case of a silicon dioxide or silicate glass second sacrificial layer 32. Alternately, the selective etchant can comprise potassium hydroxide (KOH), tetramethyl ammonium hydroxide (TMAH) preferably doped with silicon, or ethylenediamine pyrocatechol (EDP) etchant in the case of a polysilicon second sacrificial layer 32. The etchant composition is selected to dissolve the second sacrificial layer 32, but not to substantially attack any of the other materials that surround and contact the second sacrificial layer 32 in FIG. 2i, thereby allowing these other materials to act as an etch stop.

After the etch release step, the membrane 14 assumes a curvilinear cross-sectional shape as shown in FIG. 1 due to the compressive stress in the deposited material forming the membrane 14. The resilience of member 18 allows for a limited vertical and/or horizontal movement of the membrane 14 to accommodate the stress in the membrane 14 during electrostatically switching between the two stable or quiescent mechanical states which have opposite (i.e. mirror-image) symmetry as shown in FIGS. 1 and 3j.

FIGS. 3a–3j show an alternate series of process steps for forming the first example of the bistable MEM actuator device 10 in a cavity 34 formed in the substrate 12. This alternate series of process steps is particularly useful for fabricating one or more bistable MEM actuator devices 10 on a silicon substrate 12, with or without additional electronic circuitry being integrated on the substrate 12 with the devices 10.

Figure 3A:
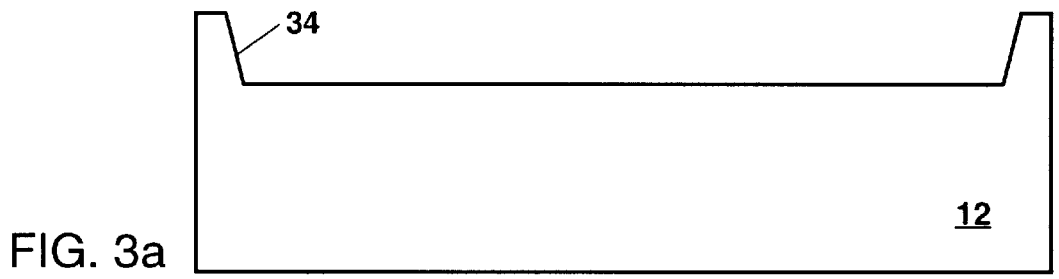
FIGS. 3a–3j show schematic cross-section views of an alternate series of process steps for forming the first example of the bistable MEM actuator in a cavity formed in the substrate.

In FIG. 3a, an open cavity 34 is etched into a silicon substrate 12. The cavity 34 is preferably formed by a bulk micromachining process after providing a masking layer (not shown) of about 500 nanometers of a deposited and densified silicate glass (e.g. TEOS) over the substrate 12. The cavity 34 is then etched into the substrate 12 using wet and/or dry etch processes. A preferred etching process uses an anisotropic etchant such as KOH, TMAH or EDP to form the cavity 34 to a depth of about 2–10 μm with a substantially planar bottom surface and sloping inner sidewalls formed by selective etching along preferred (111) crystallographic planes as shown in FIG. 3a. After formation of the cavity 34, the patterned masking layer can be removed, for example, with a buffered oxide etchant comprising HF.

Figure 3B:
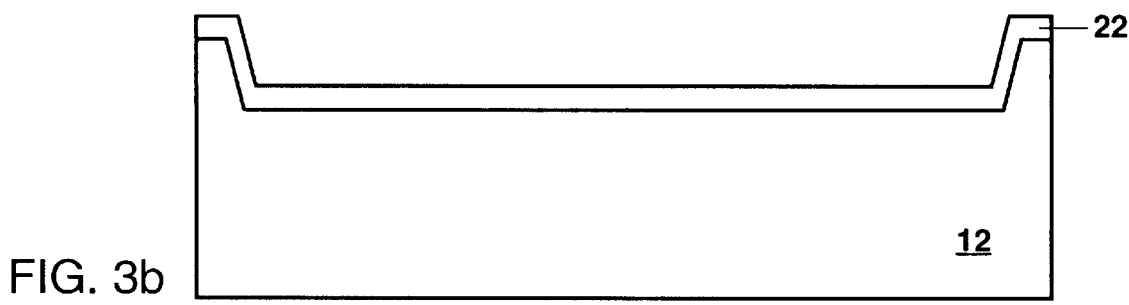

In FIG. 3b, an insulating layer 22 comprising silicon nitride or silicon dioxide can be deposited to blanket the silicon substrate 12 and the open cavity. In the case of a silicon nitride insulating layer 22, a thin blanket layer of a thermal oxide (e.g. about 60 nanometers of silicon dioxide) can be formed prior to deposition of the silicon nitride in order to protect the bare silicon substrate 12.

Figure 3C:
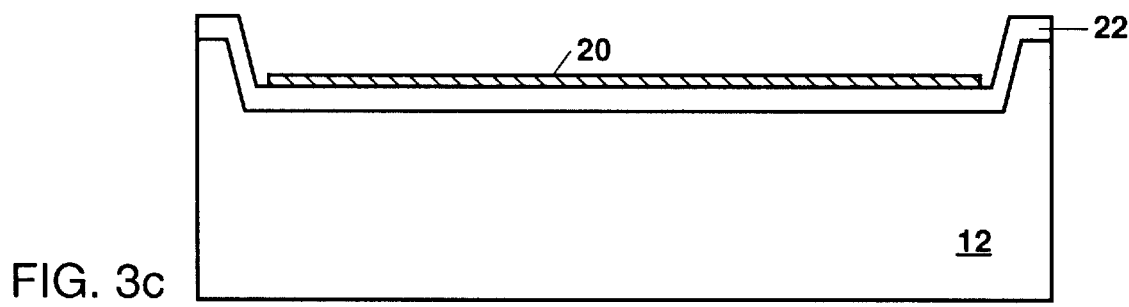
Figure 3D:
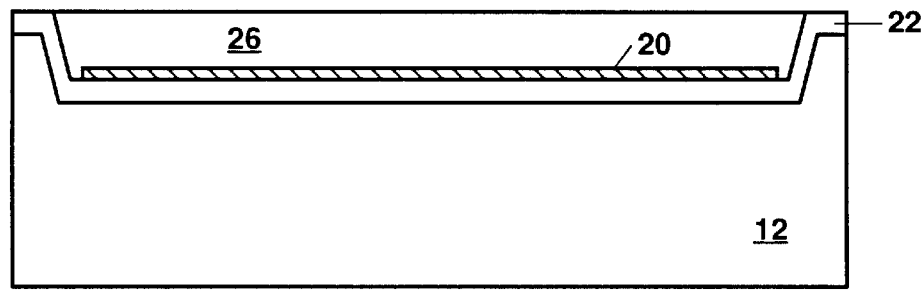

In FIG. 3c, one or more lower electrodes 20 can then be formed in the cavity 34 as described heretofore with reference to FIG. 2b. A first sacrificial layer 26 (e.g. silicon dioxide or silicate glass in the case of a silicon nitride insulating layer 22; or polysilicon in the case of a silicon dioxide insulating layer 22) is then deposited by CVD or PECVD to fill in the cavity 34 and preferably extend upward beyond the insulating layer 22 so that the layer 26 can be planarized by chemical-mechanical polishing (CMP) using the insulating layer 22 above the substrate 12 as a polishing stop. FIG. 3d shows the substrate 12 and overlying layers after the planarization step.

Figure 3E:
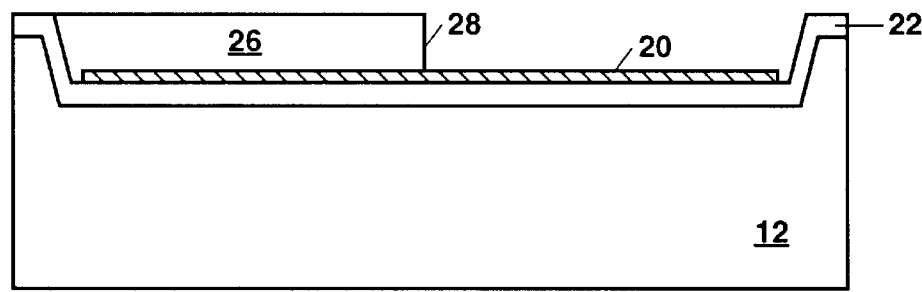
Figure 3F:
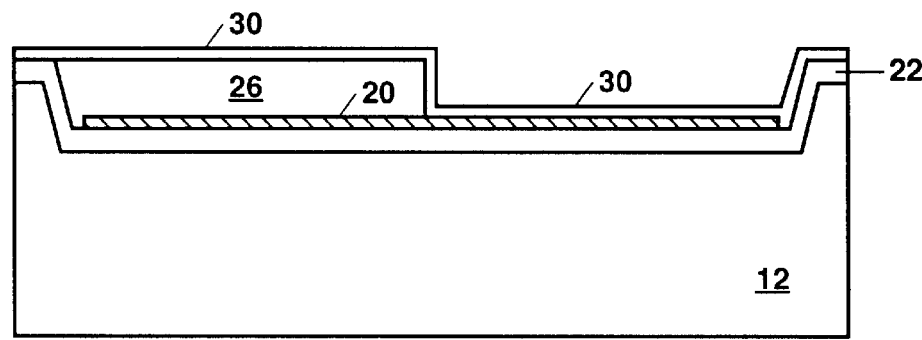

In FIG. 3e, a patterned etch mask is provided above the first sacrificial layer 26 for anisotropically etching the layer 26 (e.g. by reactive ion etching) to form a sidewall 28 on which the resilient member 18 can be formed. The resilient member is preferably formed as described heretofore with reference to FIGS. 2e and 2f. Briefly, a resilient-member-forming layer 30 is blanket deposited to a predetermined thickness as shown in FIG. 3f; and then the layer 30 is anisotropically reactive ion etched as described heretofore with reference to FIG. 2e to remove all of the layer 30 except for an upright portion deposited on the sidewall 28 which forms the resilient member 18. No supports 16 need be fabricated in this embodiment of the present invention since the membrane 14 can be attached on its edges to portions of the insulating layer 22 that extend above the surface of the substrate 12 and act as supports (see FIG. 3i). In other embodiments of the present invention, the resilient member 18 can be formed by deposition and etching processes in a trench etched into the first sacrificial layer 26.

Figure 3G:
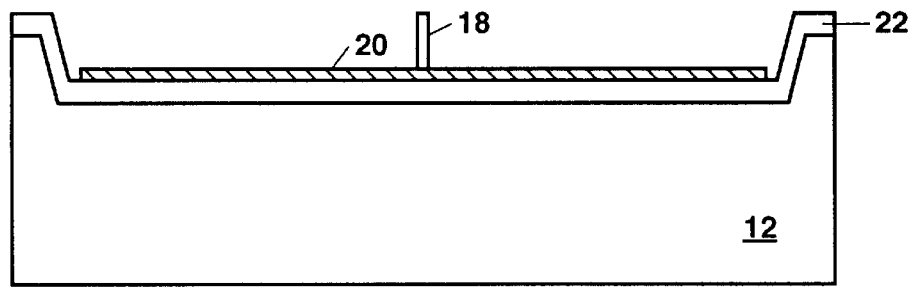
Figure 3H:
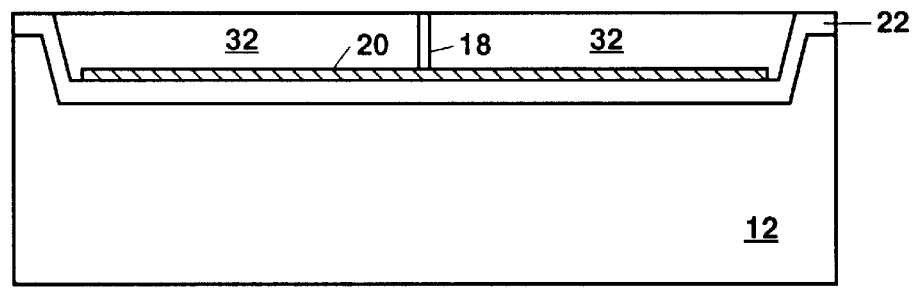

In FIG. 3g, the first sacrificial layer 26 can be removed and replaced by a second sacrificial layer 32 as shown in FIG. 3h. The second sacrificial layer 32 can then be planarized by CMP to expose the resilient member 18 and to provide a smooth planar surface upon which to deposit the membrane 14. Alternately, the second sacrificial layer 32 can simply be deposited to fill in the trench and cover the remaining first sacrificial layer 26 after the steps described with reference to FIG. 3f, with the layers 26 and 32 being planarized thereafter.

Figure 3I:
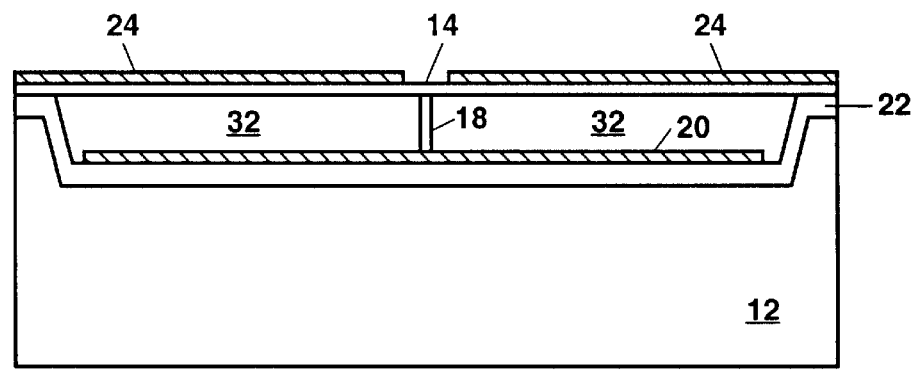
Figure 3J:
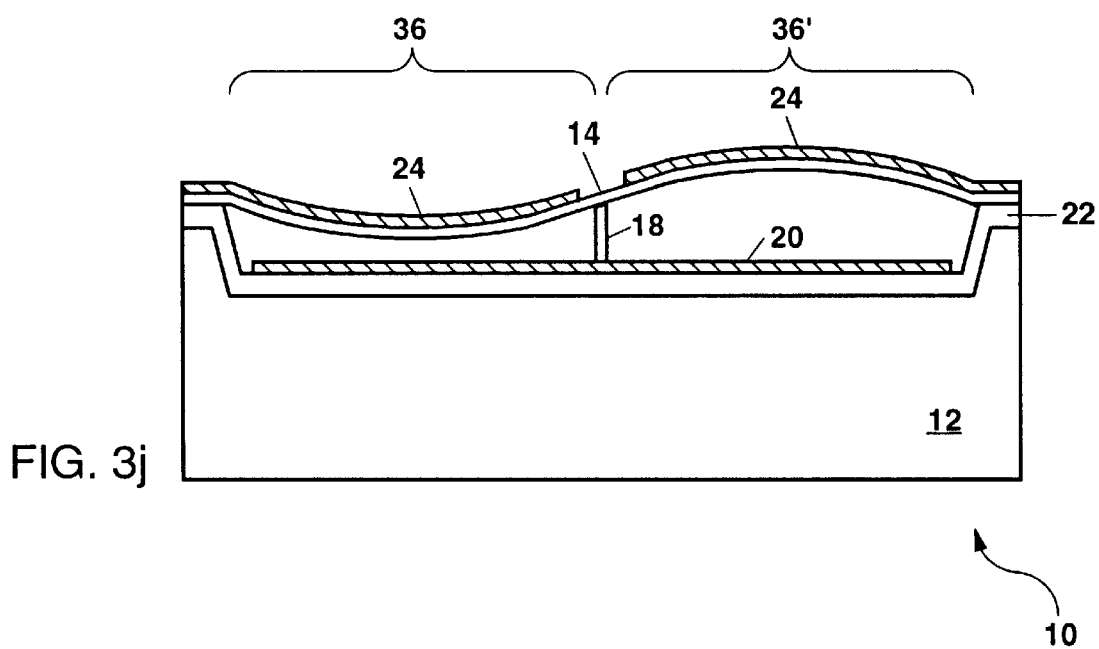

In FIG. 3i, the membrane 14 is deposited or grown as described heretofore with reference to FIG. 2h. The membrane 14 is patterned to provide lateral dimensions as described heretofore, with access regions or channels (not shown) being provided alongside or through the membrane 14 so that the second sacrificial layer 32 can be removed by etching as described heretofore to release the membrane 14 for movement. Patterned upper electrodes 24 can formed above the membrane 14 by deposition and patterning as shown in FIG. 3i, or alternately within the membrane 14 (e.g. by ion implantation or impurity dopant diffusion), or below the membrane 14 (e.g. by depositing and patterning the electrodes 24 before depositing the membrane 14).

The released bistable MEM actuator device 10 is shown in FIG. 3j. The superposed lower and upper electrodes, 20 and 24, on each side of the device 10 in FIG. 3j form air-gap capacitors, 36 and 36', having plates formed by the electrodes, 20 and 24, that are moveable in a vertical direction in response to an electrostatic force produced by a programming voltage, V, applied across the electrodes 20 and 24 as shown in FIG. 1. In some embodiments of the present invention, a common upper electrode 24 can be formed superposed above a pair of lower electrodes; whereas in other embodiments of the present invention, a pair of separate upper electrodes 24 can be provided superposed above a common lower electrode as shown in FIGS. 1 and 3j.

The programming voltage, V, can be provided by an electrical signal generator 100 (including an integrated circuit microcontroller or computer which either provides the programming voltage directly, or controls a power supply or the like to indirectly provide the programming voltage) that preferably further includes addressing circuitry 110 shown schematically in FIG. 1 for selecting an appropriate pair of electrodes, 20 and 24, for activation. In some embodiments of the present invention, integrated circuitry (e.g. CMOS or bipolar circuitry) can be formed on the substrate 12 proximate to one or more actuatable membranes 14 by processes believed to be well known (see e.g. U.S. Pat. Nos. 5,504,026 and 5,550,090; and an article by Roger T. Howe et al. in *Sensors and Actuators A*, vol. 56, pages 167–196, 1996, entitled "Polysilicon Integrated Microsystems: Technologies and Applications"), thereby providing the electrical signal generator 100 and addressing circuitry 110 on the substrate 12 to form a compact microelectromechanical system.

Electrostatic switching of the bistable MEM actuator device 10 between a pair of mechanical states thereof can be accomplished by providing the programming voltage, V, across the electrodes 20 and 24 of the air-gap capacitor, 36 or 36', that has the larger electrode separation (i.e. the programming voltage is provided across air-gap capacitor 36 in FIG. 1, or air-gap capacitor 36' in FIG. 3j for switching of the mechanical states). The programming voltage, V, produces an electrostatic force of attraction between the electrodes, 20 and 24, to which the programming voltage is applied, with an electrostatic force of sufficient magnitude acting to move the membrane 14 downward on that side of the device 10 wherein the programming voltage is applied. Due to a mechanical coupling between each side of the membrane 14 (i.e. the portion of the membrane 14 in one of the air-gap capacitors, 36 or 36') produced by the compressive stress and the pinning of the membrane 14 by the resilient member 18 and supports 16, each side of the membrane 14 moves in an opposite direction. Thus, as one side of the membrane 14 is moved downward by the electrostatic force of attraction generated by the programming voltage, V, the other side of the membrane is forced upward to accommodate the internal stress that is built into the membrane 14. The exact programming voltage that must be applied to the air-gap capacitor, 36 or 36', for switching of the device 10 between mechanical states thereof will depend upon a predetermined separation between the lower and upper electrodes, 20 and 24 after release of the device 10. Furthermore, each mechanical state of the device 10 is stable (i.e. unchanging) in the absence of the programming voltage.

To form a mechanical nonvolatile memory based on the first example of the present invention, an array of devices 10 forming memory elements can be provided either above a substrate 12 as shown in FIG. 1, or within a plurality of cavities 34 formed in the substrate 12 as shown in FIG. 3j. Each memory element can be programmed in a predetermined mechanical state as described above, and switched between the pair of mechanical states by applying the programming voltage to one of an appropriate air-gap capacitor, 36 or 36', as described heretofore. The mechanical state of a memory element can be read out by electrically measuring the capacitance of one or both air-gap capacitors, 36 and 36' using electrodes 20 and 24. Alternately, a separate pair of readout electrodes (not shown) can be formed proximate to electrodes 20 and 24 on one or both sides of the membrane 14. In some embodiments of the present invention, one or more piezoresistors can be deposited above the membrane 14 and used to read out the mechanical state of the device 10. Addressing of a memory array of devices 10 can be accomplished with interconnect wiring deposited and patterned during formation of the devices 10.

EXAMPLE 2

Figure 4A:
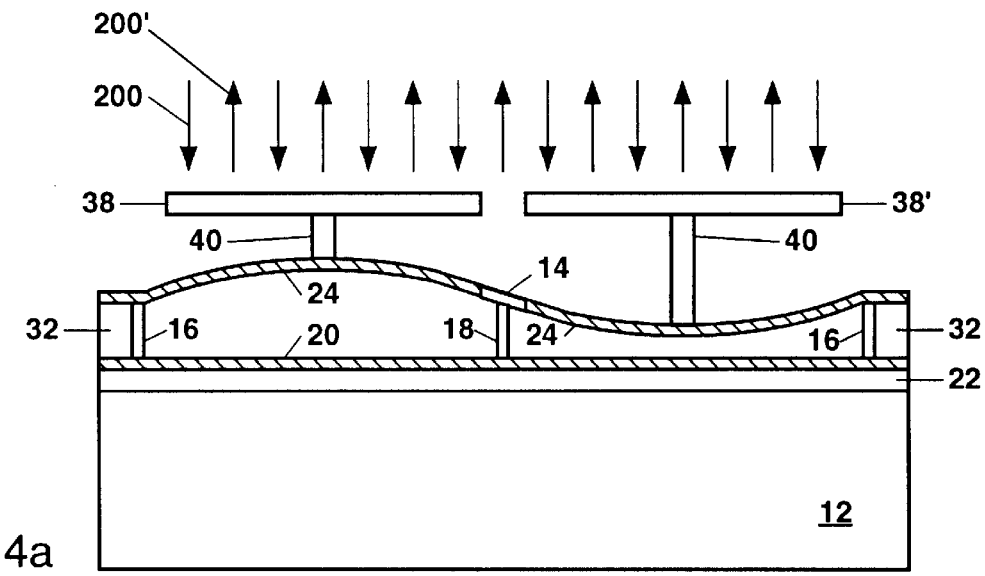
FIGS. 4a and 4b show schematic cross-section views of a second example of a bistable MEM actuator according to the present invention in the form of an optical modulator.
Figure 4B:
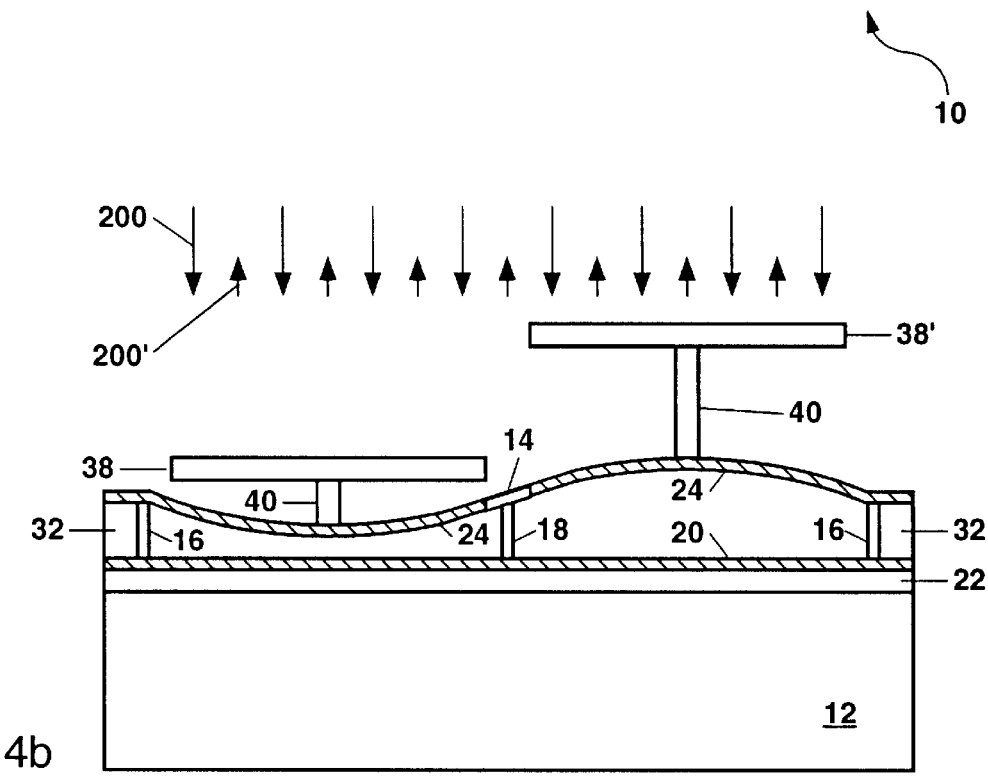

FIGS. 4a and 4b show schematic cross-section views of a second example of the bistable MEM actuator device 10 of the present invention in the form of an optical modulator (i.e. a spatial light modulator). The optical modulator 10 in FIGS. 4a and 4b can be formed as described heretofore with reference to FIGS. 1–3, with a series of additional process steps being provided as shown in FIGS. 5a–5f for forming a pair of synchronously moveable mirrors 38 and 38' supported on posts 40 above the membrane 14.

Figure 5A:
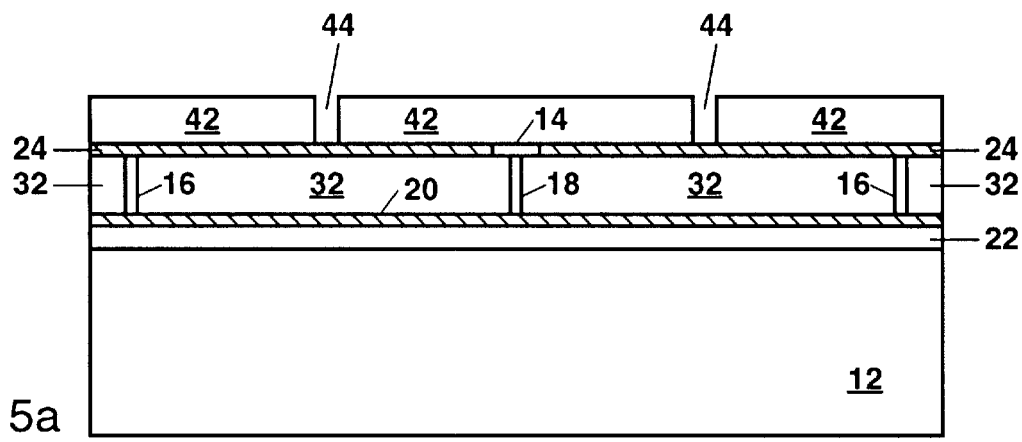
FIGS. 5a–5f show schematic cross-section views of a series of additional process steps to be used with the process steps of FIGS. 2a–2i for forming the optical modulator of FIGS. 4a and 4b.

In FIG. 5a, a third sacrificial layer 42, preferably having a composition the same as the second sacrificial layer 32, is deposited by CVD or PECVD above membrane 14 beginning with a structure as shown in FIG. 2i, or alternately the structure of FIG. 3i (i.e. after the process steps completing formation of the unreleased membrane 14). The third sacrificial layer 42 can have a thickness of up to a few microns depending upon an amount of downward bowing of the membrane 14 after release. Thus, the layer 42 should preferably be sufficiently thick so that a first-formed mirror 38 does not come into contact with the membrane 14 after release thereof. Furthermore, the bowing of the membrane 14 after release can be predetermined to provide a maximum vertical separation between the mirrors, 38 and 38', that is related to a wavelength of the light to be modulated by the optical modulator device 10.

In FIG. 5a, openings 44 are anisotropically etched through the third sacrificial layer 42 down to the membrane 14, or to an upper electrode 24 formed thereon. The openings 44 are formed at the location of each support post 40 which is generally centered at a position of minimum or maximum vertical deflection of the released membrane 14 so that the mirrors 38 can be translated vertically without rotation.

Figure 5B:
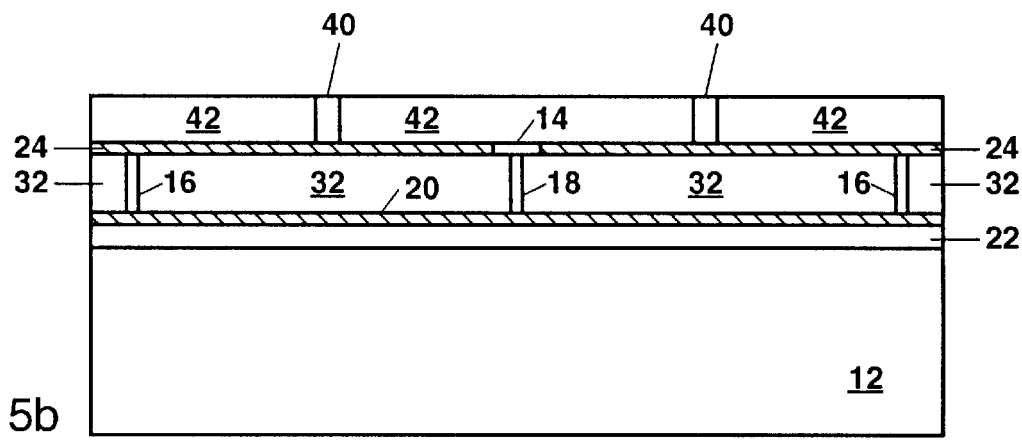

In FIG. 5b, a support post material such as polysilicon, silicon nitride, silicon dioxide, a metal or a metal alloy is deposited to fill in the openings 44 to form or build up each support post 40. Any excess material used for forming the support posts 40 that extends upward above the third sacrificial layer 42 can be removed by a planarization or polishing step (e.g. CMP) for planarizing an upper surface of the second sacrificial layer 42 prior to deposition of a mirror-forming layer 46, or for precisely adjusting the thickness of the third sacrificial layer 42.

Figure 5C:
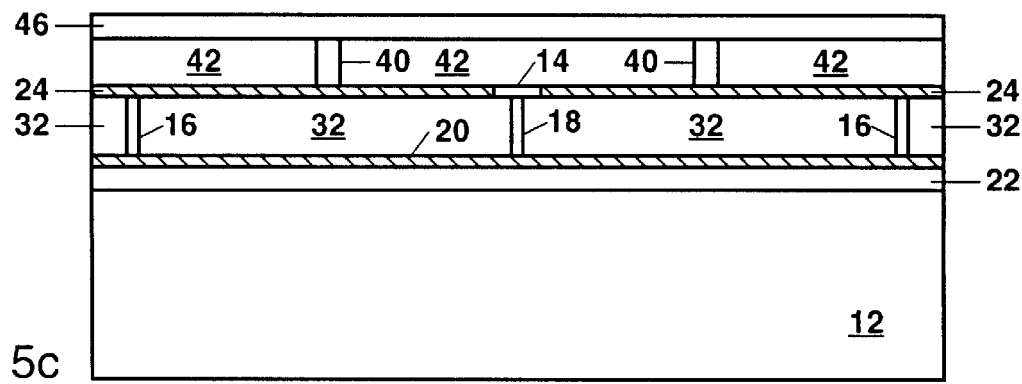
Figure 5D:
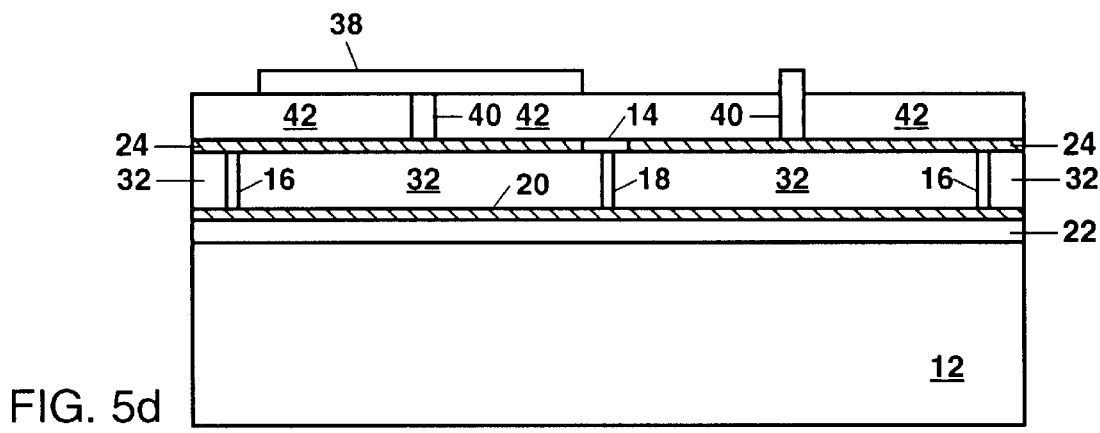

In FIG. 5c, the mirror-forming layer 46 is deposited to blanket the upper surface of the third sacrificial layer 42, and to contact the posts 40 to form an attachment thereto. The layer 46 can be polished (e.g. by CMP), if necessary, to provide a smooth light-reflecting upper surface to form a first-formed mirror 38. In FIG. 5d, the mirror-forming layer 46 is laterally patterned by etching (e.g. reactive ion etching) through an overlying photolithographically defined etch mask (not shown) to provide a predetermined shape (generally rectangular or square) for the first-formed mirror 38. The mirror-forming layer 46 can also be used to an extension to the support post 40 not contacting the first-formed mirror 38. The mirror-forming layer 46 generally comprises the same material (i.e. polysilicon, silicon nitride, silicon dioxide, a metal or a metal alloy) forming the support posts 40. In some embodiments of the present invention, a single deposition step can be used to form both the first-formed mirror 38 and its underlying support post 40.

Figure 5E:
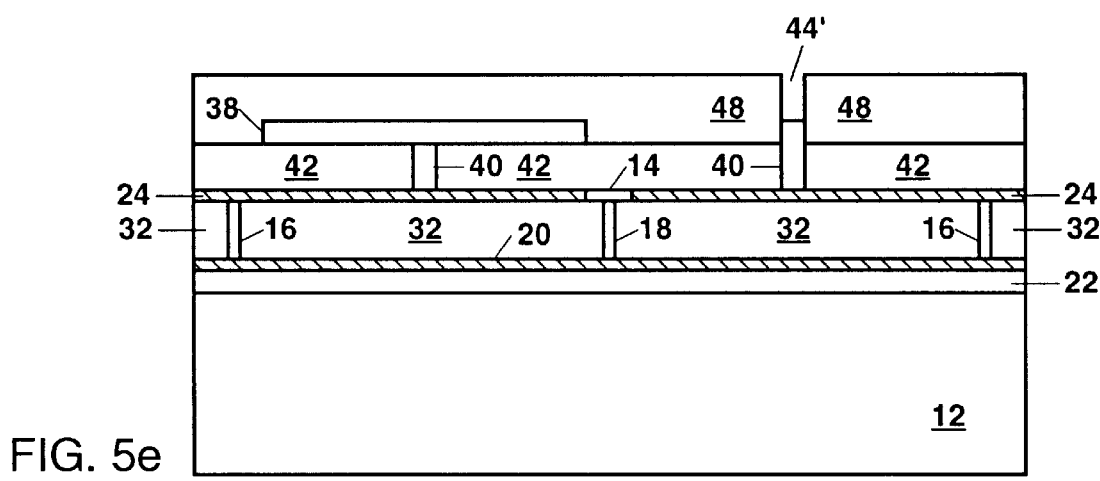

In FIG. 5e, a fourth sacrificial layer 48, preferably with the same composition as the third sacrificial layer 42, is deposited above the first-formed mirror 38 and above the third sacrificial layer 42 to a predetermined layer thickness that depends upon the bowing of the membrane 14 after release. The layer 48 can be planarized (e.g. by CMP) to provide a smooth surface for deposition of the second-formed mirror 38'. Additionally, the layer 48 can be planarized to provide a predetermined vertical separation or spacing between the mirrors 38 and 38' so that, upon release of the mirrors and underlying membrane 14, the light-reflecting surfaces of the mirrors 38 and 38' will be substantially coplanar in one of the mechanical states of the optical modulator device 10 (i.e. forming an in-phase state as shown in FIG. 4a) and non-coplanar (i.e. vertically displaced) in the other mechanical state of the device 10 (i.e. forming an out-of-phase state as shown in FIG. 4b).

Figure 5F:
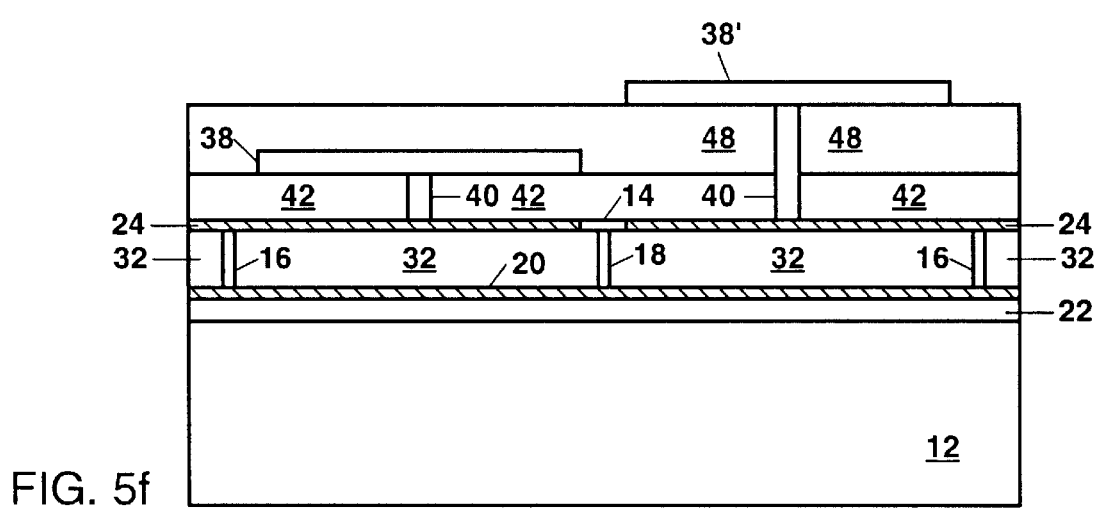

In FIG. 5e, an opening 44' is etched down to expose the support post 40 that is not covered by the first-formed mirror 38. In FIG. 5f, one or more deposition steps are provided to fill in the opening 44', thereby building up and completing the exposed support post 40. The same material used to form the first-formed mirror 38 is then blanket deposited above the fourth sacrificial layer 42 to a predetermined thickness, and is patterned by etching to form the second-formed mirror 38'. An upper surface of the second-formed mirror 38' can be planarized to provide a smooth surface for reflecting an incident light beam 200.

After forming the mirrors, 38 and 38', an etch release step, as described heretofore, can be used to remove each of the sacrificial layers, 32, 42 and 48. Each light-reflecting surface of the mirrors 38 and 38' can include a reflective coating (including metals such as aluminum or gold, metal alloys, or dielectrics) that is deposited after the etch release step or after planarizing the mirrors 38 and 38' (in which case, the reflective coating must be chemically resistant to the release etchant). The reflective coating can be tailored for the reflection of light in a particular wavelength range (i.e. a particular wavelength range of the incident light beam 200).

Figure 6A:
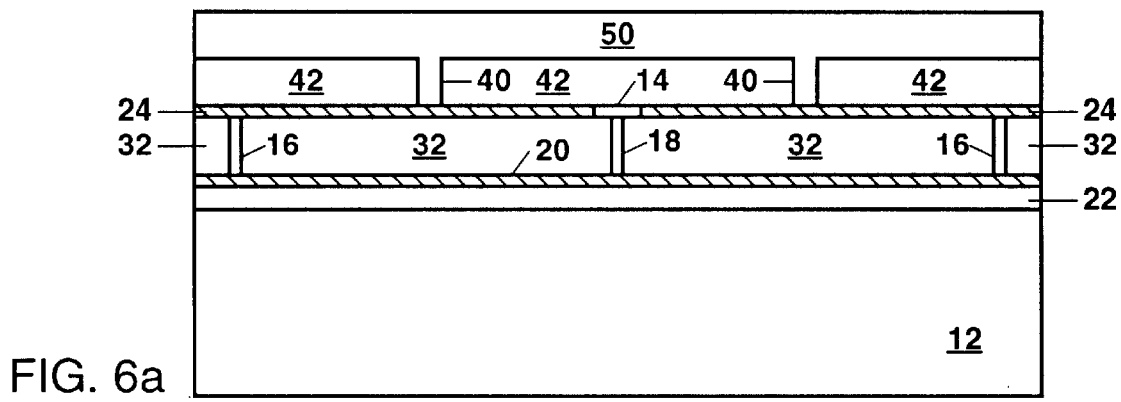
FIGS. 6a–6c show schematic cross-section views of an alternative series of process steps that can be used following the process steps of FIGS. 2a–2i and FIG. 5a to form an optical modulator similar to that shown in FIGS. 4a and 4b.
Figure 6B:
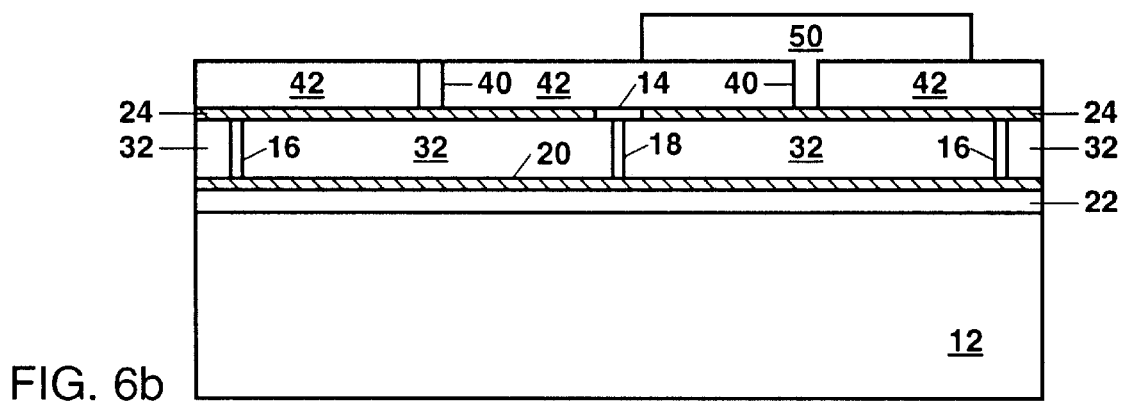
Figure 6C:
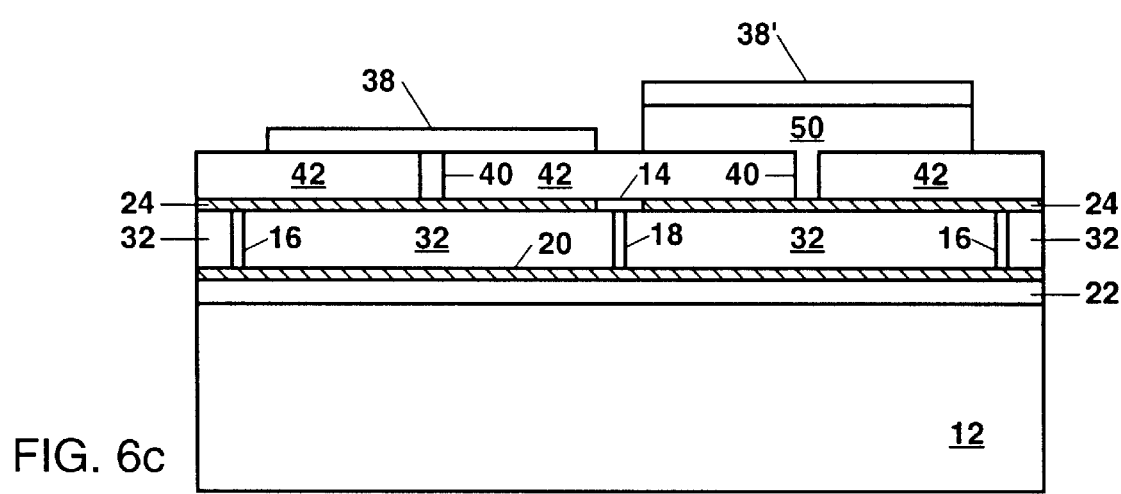

FIGS. 6a–6c show an alternative method for forming the mirrors, 38 and 38', and completing an optical modulator 10 similar to that of FIGS. 4a and 4b. In FIG. 6a, a spacer layer 50 (preferably with a composition different from the composition of the third sacrificial layer 42 and the same or different from the composition of the first mirror-forming layer 46) is deposited to blanket the third sacrificial layer 42 and fill in the openings 44 after the step described heretofore with reference to FIG. 5a. The spacer layer 50 has a predetermined thickness that depends upon the bowing of the membrane 14 after release. In FIG. 6b, the spacer layer 50 is patterned by etching to a predetermined size about that of a mirror 38' to be formed on the spacer layer 50. In FIG. 6c, the mirror-forming layer 46 is deposited over the spacer layer 50 and third sacrificial layer 42 and is patterned by etching to form the mirrors, 38 and 38'. In a step for releasing the optical modulator 10 for operation, the spacer layer 50 can be left in place by forming the layer 50 from a material that is resistant to the release etchant. Otherwise, the spacer layer 50 can be removed in part by a timed undercutting etching step with a selective etchant (e.g. an etchant selective for etching the layer 50 without etching the mirrors, 38 and 38', or the third sacrificial layer 42) prior to releasing the optical modulator 10.

Operation of the completed optical modulator is described with reference to FIGS. 4a and 4b. In FIG. 4a, the optical modulator device 10 is in an in-phase state characterized by the mirrors, 38 and 38', being substantially coplanar so that an incident light beam 200 is reflected off the mirrors substantially in-phase. In FIGS. 4a and 4b, the incident light beam 200 is denoted by downward-pointing arrows, and a reflected light beam 200' (i.e. a reflected portion of the incident light beam 200) is denoted by upward-pointing arrows. The incident light beam 200 can be directed normal to the reflecting surfaces of the mirrors, 38 and 38', as shown in FIGS. 4a and 4b, or at an angle thereto. The in-phase state of the optical modulator results in the incident and reflected light beams, 200 and 200', having about the same intensity except for any reflection losses in the mirrors 38 and 38'.

The membrane 14 can be electrostatically switched from the in-phase state to an out-of-phase state by applying a programming voltage, V, as described heretofore. In FIG. 4b, the reflected light beam 200' in the out-of-phase state is weak compared to the incident beam 200 due to a phase shift across the width of the beams, 200 and 200', that results in a partial or total cancellation of the reflected light beam 200'. This phase shift results from the mirrors, 38 and 38', being vertically displaced by a distance that is preferably an odd multiple of one-quarter of the wavelength, $\lambda$, of the incident light beam 200 (i.e. $n\lambda/4$ where n is an odd integer).

The optical modulator device 10 operates digitally due to the bistable nature of the membrane 14, and can be used to modulate an incident light beam 200 at a predetermined frequency (having an upper limit that is generally limited by inertia of the mirrors, 38 and 38', and further limited by damping due to gas trapped beneath the membrane 14), or to encode the reflected light beam 200' with information in the form of a digital signal provided as the programming voltage. Additionally, an array of optical modulator devices 10 can be used for optical displays and for optical information processing (i.e. optical computing). A particular in-phase or out-of-phase state of each optical modulator device 10 in the array is stable or quiescent with each of the mirrors, 38 and 38', held stationary when the programming voltage is removed. As a result, each optical modulator device 10 forms a nonvolatile optical memory element so that particular optical modulators 10 in the array need not be reprogrammed until information addressed to those optical modulators changes. Thus, operation of the optical modulator 10 of the present invention is simplified compared to other types of optical modulators that require a holding voltage for maintaining a particular state.

The process steps shown in either of FIGS. 2a–2i or FIGS. 3a–3i can be used as a starting point to form an optical modulator 10 as described above. Furthermore, those skilled in the art will understand that other embodiments of an optical modulator 10 can be formed according to the teaching of the present invention. Finally, the electrical signal generator 100 and addressing circuitry 110 for activating one or more optical modulators 10 can be provided on the substrate 12 as described heretofore with reference to FIG. 1 to form a compact microelectromechanical system.

EXAMPLE 3

Figure 7A:
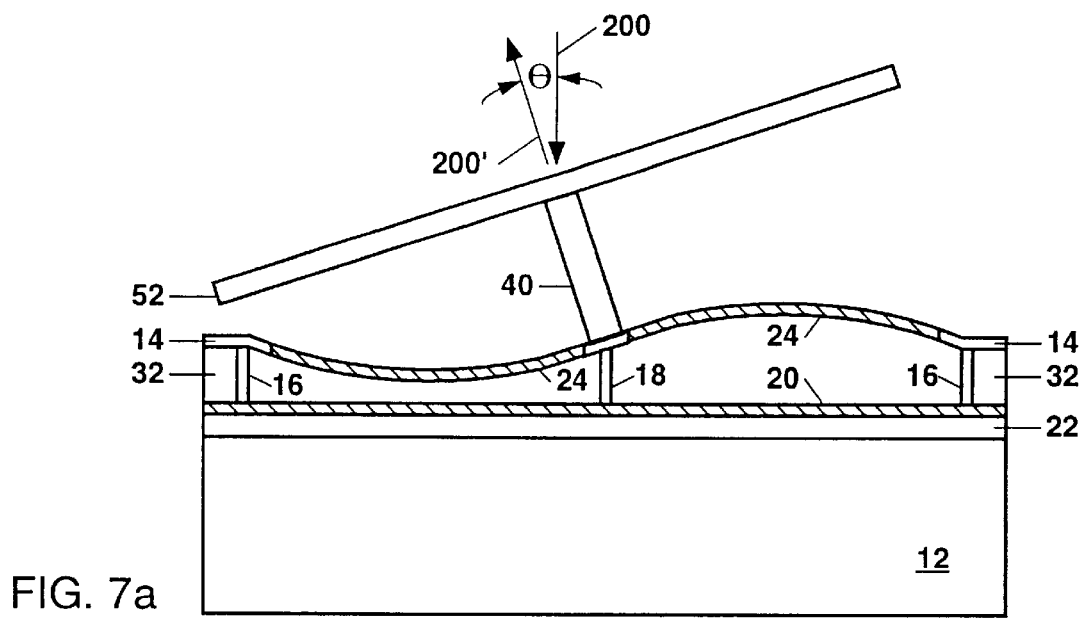
FIGS. 7a and 7b show schematic cross-section views of a third example of a bistable MEM actuator according to the present invention in the form of a switchable mirror.
Figure 7B:
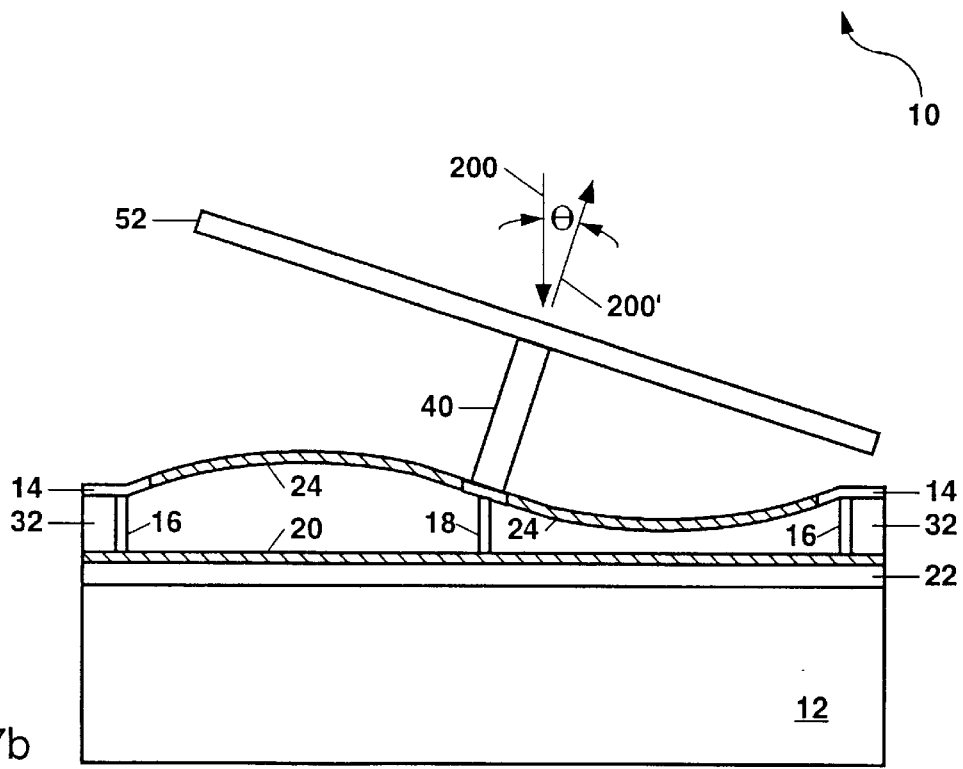

FIGS. 7a and 7b show schematic cross-section views of a third example of the bistable device 10 of the present invention in the form of a switchable mirror device 10, also termed herein an optical beam deflector or a rotatable mirror. The switchable mirror device 10 in FIGS. 7a and 7b can be formed using the same process steps described heretofore with reference to the first and second examples of the present invention. For example, the process steps shown in FIGS. 2a–2i and FIGS. 5a–5d can be used except that only a single deflecting mirror 52 is provided, with the single deflecting mirror 52 and support post 40 being preferably centered on the membrane 14 above the resilient member 18 so that the post 40 supports the mirror 52 along a direction of rotation of the membrane 14. The mirror 52 can be formed in a manner similar to that described heretofore for mirror 38 with reference to FIGS. 5a–5d, except that the mirror 52 is generally larger in size than the mirror 38.

After release, the mirror 52 assumes one of two angular states characterized by a tilt angle of $\ominus$ in a counterclockwise direction (see FIG. 7a) or in a clockwise direction (see FIG. 7b) with respect to an axis normal to the lower electrode 20. Each angular state of the switchable mirror device 10 corresponds to a particular mechanical state of the membrane 14. The resilient member 18 accommodates a tilting of the membrane 14 near a line of attachment thereto upon release of the membrane 14.

A light beam 200 incident on the mirror 52, with the device 10 in a particular angular state as shown in FIG. 7a, undergoes an angular deflection by the angle $\ominus$ (i.e. a counterclockwise angular deflection of a reflected light beam 200' in FIG. 7a). When the mechanical state of the switchable mirror device 10 is switched by applying a programming voltage, V, across a set of electrodes 20 and 24 as described heretofore with reference to FIG. 1, the incident light beam 200 is deflected in an opposite direction (i.e. in the clockwise direction as shown in FIG. 7b) as the angular state is switched to rotate the mirror 52 to a precise resting point or angle. Inertia of the mirror 52 and damping due to gas trapped underneath the membrane 14 and mirror 52 will determine a speed for switching of the mirror 52.

In switching from a first mechanical state as shown in FIG. 7a to a second mechanical state which is a mirror image of the first state as shown in FIG. 7b, the switchable mirror device 10 steers the reflected light beam 200' through a total angular deflection of $2\ominus$. The exact value of the total angular deflection depends on a curvilinear cross-sectional shape assumed by the membrane 14 upon release (i.e. on the amount of bowing of the membrane 14). According to one embodiment of the present invention, the total angular deflection can be about 14°.

Upon removing the programming voltage, the angular state and deflection angle of the incident light beam 200 is maintained until the device 10 is electrically programmed to switch states. Thus, operation of the device 10 of the present invention is simplified compared to other types of switchable mirrors that require a holding voltage for maintaining a particular state. Furthermore, since there is no physical contact between elements of the switchable mirror during operation thereof, stiction is prevented, thereby improving reliability of the device and eliminating the need for a release voltage (i.e. a reset signal) to overcome stiction prior to switching states of the device 10.

This third example of the present invention has applications for forming optical displays (e.g. projection displays), optical information processors and optical readouts. In one angular state of the device 10, the reflected light beam 200' can be blocked by a stop (not shown) to improve a contrast of the device 10 for display applications. Additionally, an array of switchable mirror devices 10 can be formed, with each device 10 in the array being individually addressable for switching between a pair of stable angular states. As in the case of the optical modulators 10 described heretofore, each switchable mirror device 10 in an array remains in a particular angular state and need not be reprogrammed until information addressed to that device 10 changes. Finally, the electrical signal generator 100 and addressing circuitry 110 for activating one or more switchable mirror devices 10 can be provided on the substrate 12 as described heretofore with reference to FIG. 1 to form a microelectromechanical system.

EXAMPLE 4

Figure 8A:
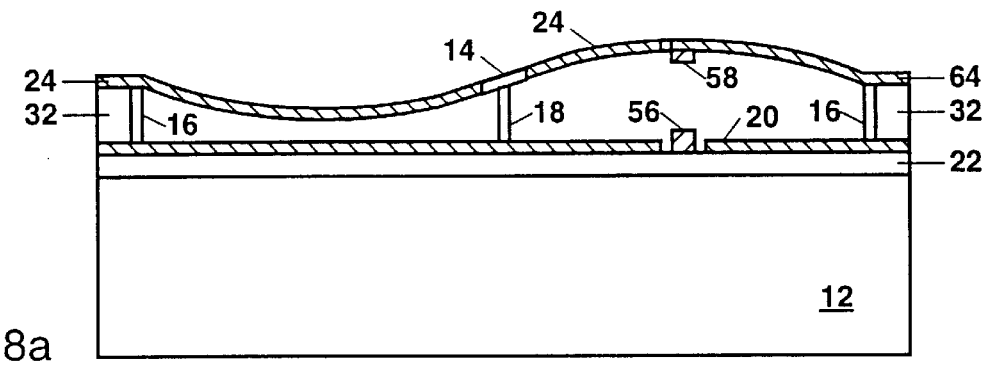
FIGS. 8a and 8b show schematic cross-section views of a fourth example of a bistable MEM actuator according to the present invention in the form of a latching relay.
Figure 8B:
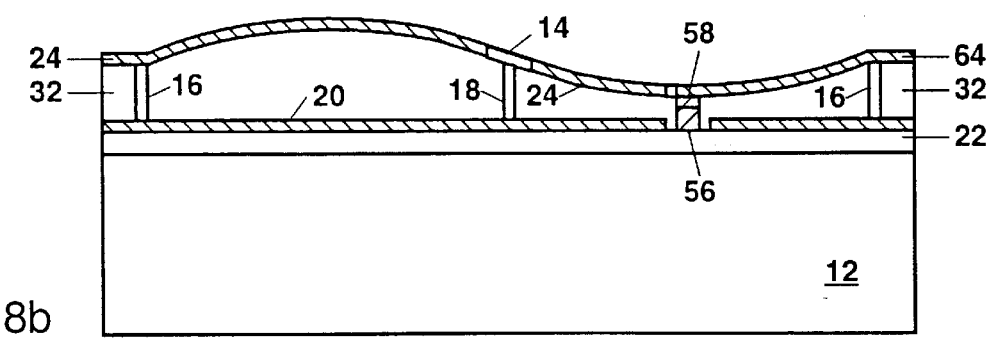

FIGS. 8a and 8b show schematic cross-section views of a fourth example of the bistable device of the present invention in the form of a latching relay 10. The latching relay 10 in FIGS. 8a and 8b can be formed using a series of process steps as shown in FIGS. 9a–9n.

Figure 9A:
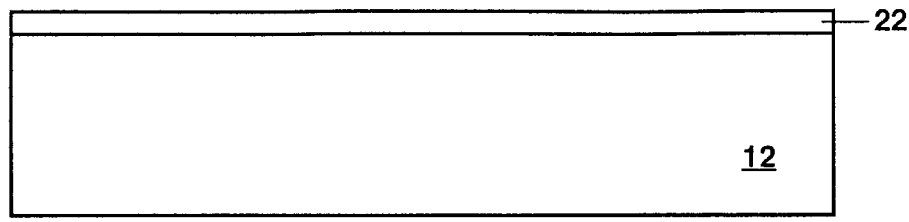
FIGS. 9a–9n show schematic cross-section views of a series of process steps for forming the latching relay of FIGS. 8a and 8b.
Figure 9B:
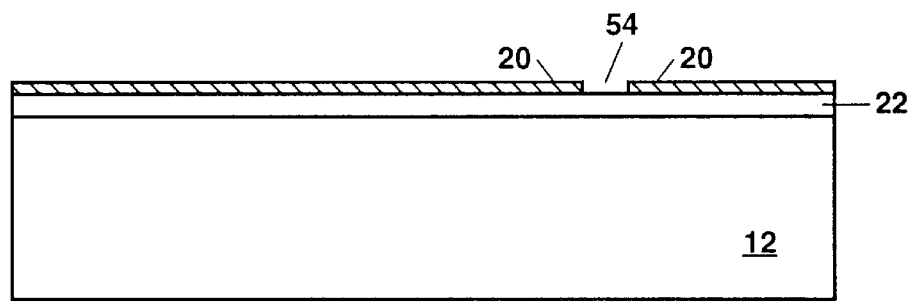
Figure 9C:
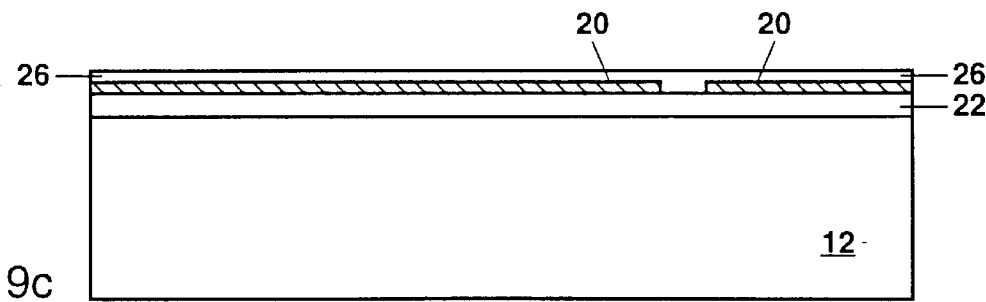
Figure 9D:
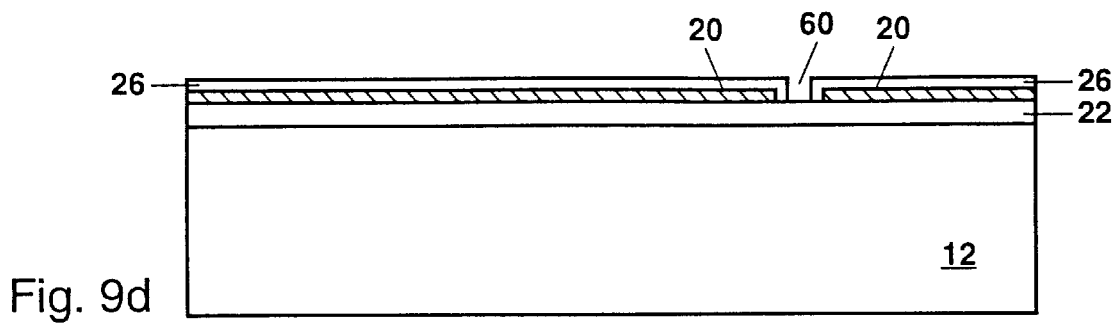
Figure 9E:
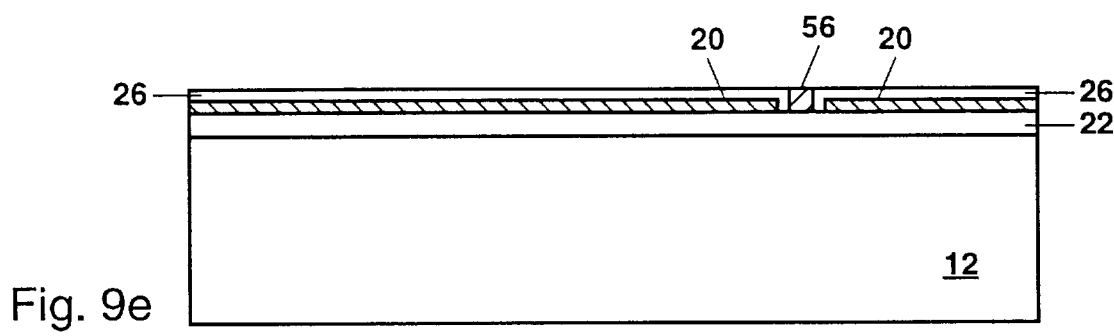
Figure 9F:
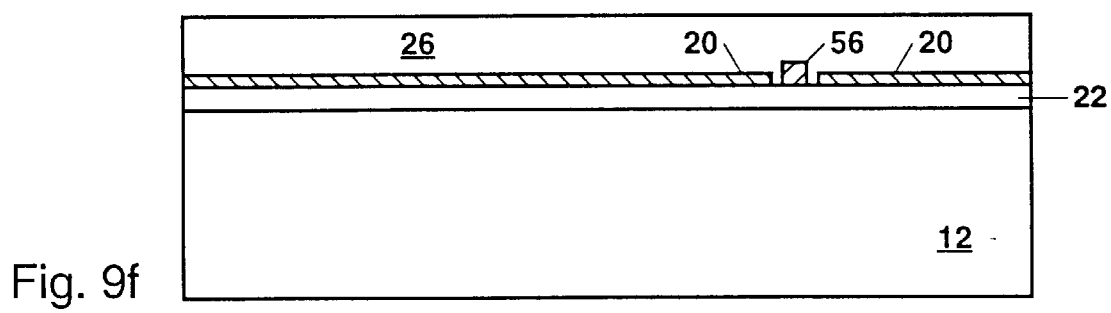
Figure 9G:
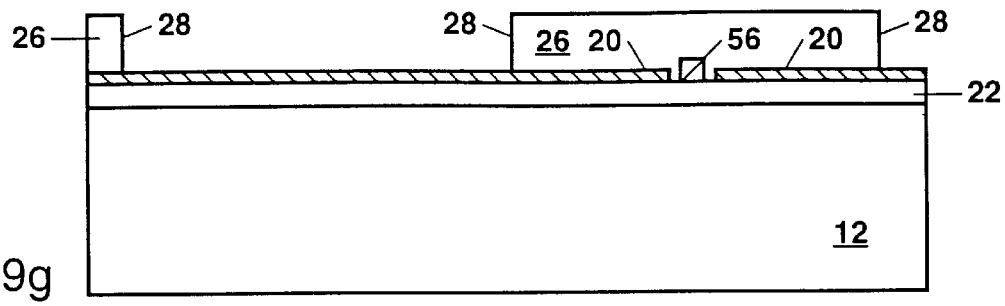
Figure 9H:
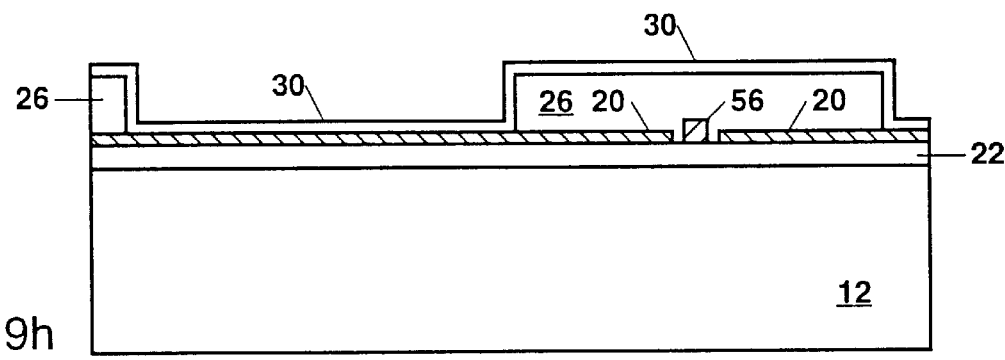
Figure 9I:
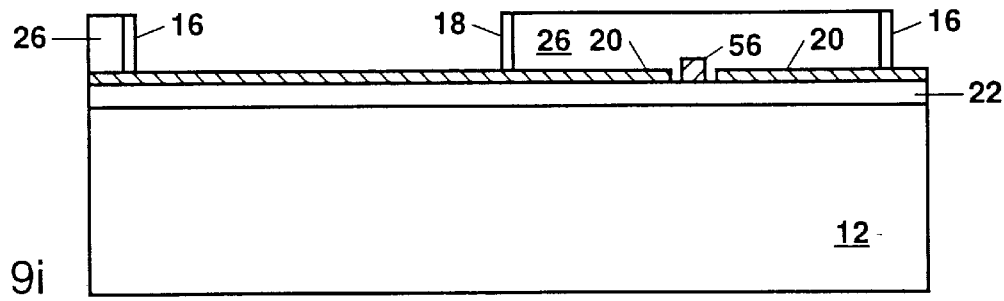
Figure 9J:
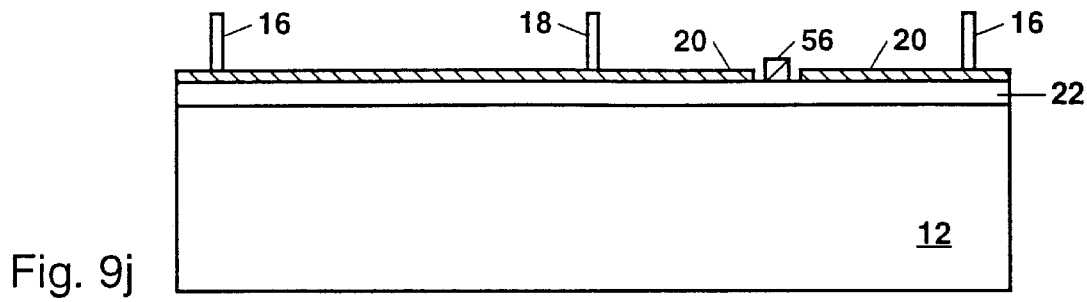
Figure 9K:
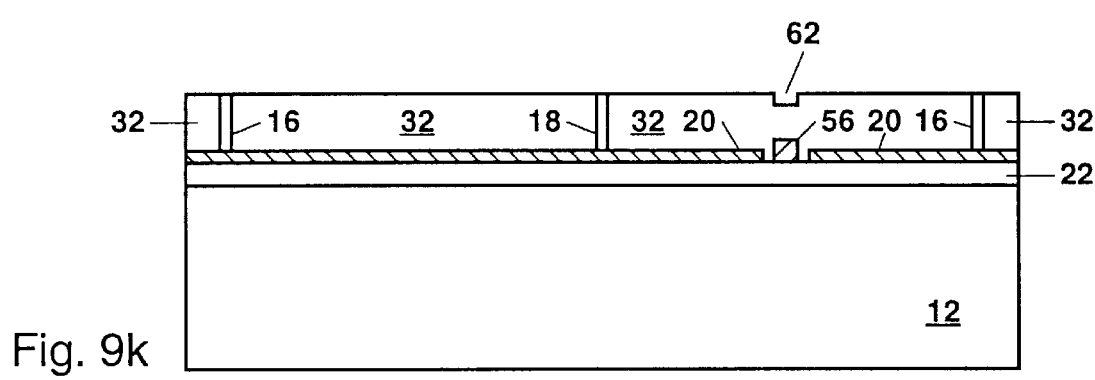
Figure 9L:
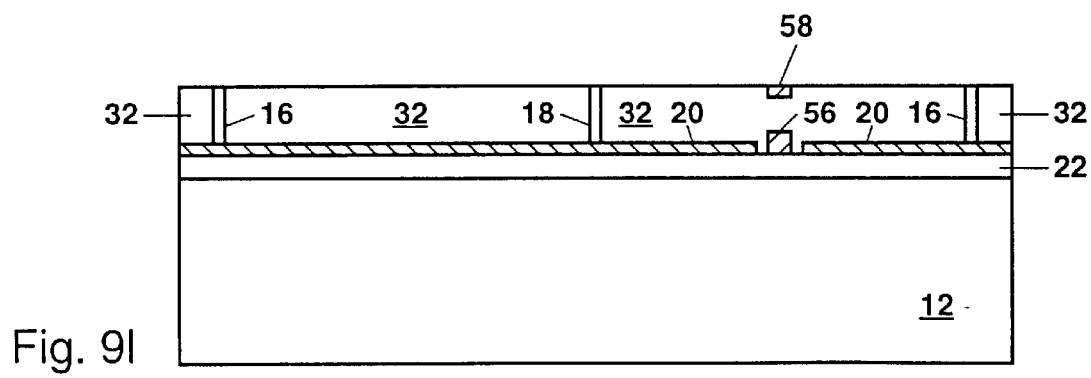
Figure 9M:
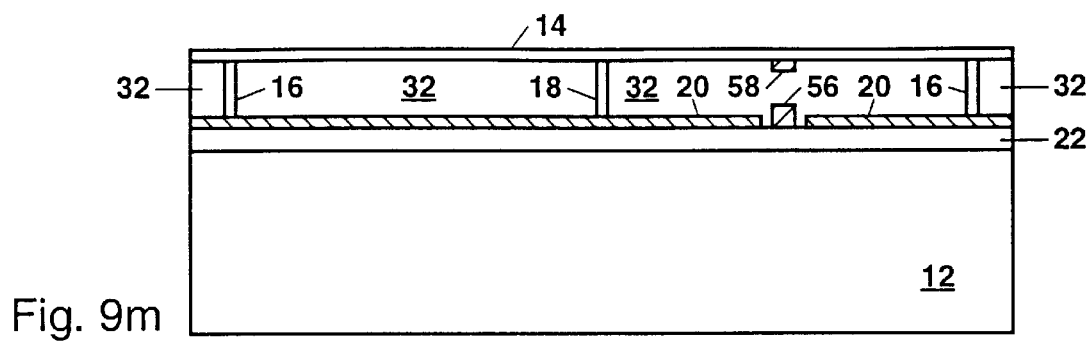
Figure 9N:
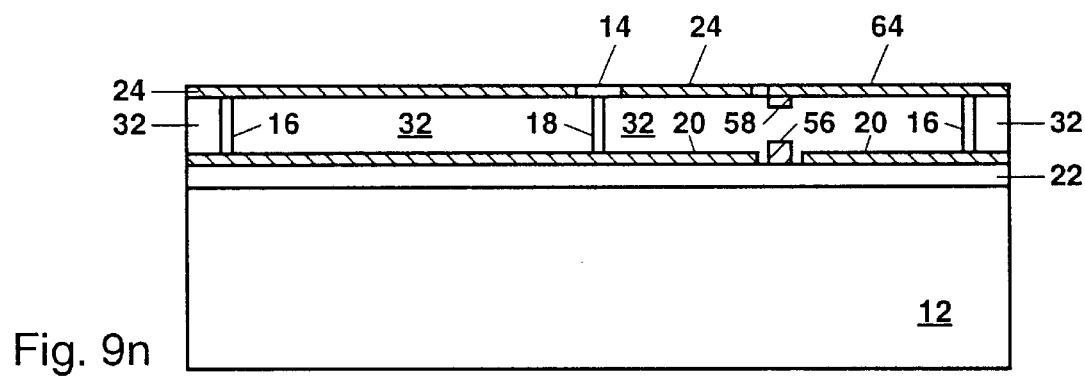

The process steps of FIGS. 9a–9n are similar to those described with reference to FIGS. 2a–2i except that additional process steps are provided to form one or more relay contacts. Although the relay contacts are preferably formed below the membrane 14, those skilled in the art will understand that the relay contacts can also be formed above the membrane 14, or both above and below the membrane 14. Furthermore, although a series of process steps are described for forming the latching relay device 10 above a semiconductor substrate 12, it will be understood that the latching relay device 10 can be formed, at least in part, in a cavity 34 by using a series of process steps similar to those described heretofore with reference to FIGS. 3a–3j. Finally, although the formation of a single-pole single-throw (SPST) latching relay 10 is described herein with reference to FIGS. 9a–9n, those skilled in the art, based on the teachings of the present invention, will be able to form other types of latching relays 10, including single-pole double-throw (SPDT) relays, double-pole single-throw (DPST) relays and double-pole double-throw (DPDT) relays.

In FIG. 9a, an insulating layer 22 (e.g. silicon nitride or silicon dioxide) is blanket deposited above the surface of the silicon substrate 12 as described heretofore with reference to FIG. 2a. In FIG. 9b, one or more lower electrodes 20 are deposited above the insulating layer 22. A single common lower electrode 20 can be patterned as shown in FIG. 9b to provide an opening or slot 54 at a predetermined location, generally at a position halfway between the resilient member 18 and one of the supports 16, wherein one or more lower relay contacts 56 are to be formed. The opening or slot 54 can be shaped (e.g. an elongate slot 54 extending in a direction generally perpendicular to the longitudinal axis of the membrane 14 which extends between the supports 16) to accommodate wiring (not shown) for providing an electrical interconnection to the lower contact 56. In some embodiments of the present invention, a plurality of lower electrodes 20 can be provided for activating the latching relay 10 and for sensing a mechanical state thereof. Interconnect wiring (not shown) can also be formed at this time for addressing each lower electrode 20 and each lower relay contact 56.

In FIG. 9c, a first sacrificial layer 26 is formed or deposited above the substrate 12 to a predetermined thickness which can be equal to the height of the lower contact 56 to be formed. The thickness of the first sacrificial layer 26 can be determined from a maximum extent of downward vertical movement (i.e. bowing) of the membrane 14 upon release, and whether or not an upper relay contact 58 is to be formed extending below the membrane 14 as shown in FIGS. 8a and 8b. The composition of the first sacrificial layer 26 has been described heretofore with reference to FIG. 2c.

In FIG. 9d, a shaped through-hole 60 is etched down to the insulating layer 22 (or down to the substrate 12 in embodiments of the present invention wherein the substrate 12 provides an electrical interconnection to the lower contact 56). In FIG. 9e, the lower relay contact 56 is formed by one or more steps for depositing metals or metal alloys (including hard or soft gold) to fill in the through-hole 60. After the lower relay contact 56 is formed, a top surface of the first sacrificial layer 26 can be planarized (e.g. by CMP) to remove any metal deposited above the layer 26, to determine a precise height for the lower contact 56 and to provide a smooth upper surface for the contact 56.

In FIG. 9f, additional sacrificial material is deposited to bury the lower contact 56 and to build up the height of the first sacrificial layer 26 to a predetermined height required for forming a resilient member 18 and supports 16. In FIG. 9g, the first sacrificial layer 26 can be patterned by etching to form a plurality of sidewalls 28 whereon material is to be deposited for forming the supports 16 and the resilient member 18.

In FIG. 9h, a resilient-member-forming layer 30 as described heretofore with reference to FIG. 2d is blanket deposited over the patterned first sacrificial layer 26. The resilient-member-forming layer 30 is then anisotropically reactive ion etched to leave the resilient-member-forming layer 30 on the sidewalls 28, thereby forming the supports 16 and the resilient member 18 as shown in FIG. 9i.

In FIG. 9j, the first sacrificial layer 26 can be removed by a selective etchant to leave the resilient member 18 and the supports 16 standing. In FIG. 9k, a second sacrificial layer 32 (e.g. with the same composition as the first sacrificial layer 26) can be deposited over the substrate 12 and planarized down to the resilient member 18 and the supports 16 (e.g. by CMP) to provide a smooth upper surface for deposition of the membrane 14. A recess 62 can be etched into the second sacrificial layer 32 at the location of an optional upper relay contact 58.

In FIG. 9l, a metal or metal alloy, with a composition the same as or different from the lower contact 56, can deposited in the recess 62 to form the optional upper relay contact 58 superposed with the lower contact 56. In a preferred embodiment of the present invention, one of the relay contacts, 56 or 58, comprises a hard gold, and the other relay contact comprises a soft gold. After deposition, the second sacrificial layer 32 can be planarized to remove any metal remaining above the layer 32 from the deposition process.

In FIG. 9m, the membrane 14, with a composition and dimensions as described heretofore with reference to FIG. 2h, is blanket deposited on the second sacrificial layer 32 to contact the resilient member 18, the supports 16 and the upper relay contact 58 and form attachments thereto. The membrane 14 is patterned by etching to provide, for example, a rectangular shape with a width of generally about 1–10 $\mu$m or more, and a length between the supports 16 of up to 20 times the width. The exact dimensions for the membrane 14 will depend upon whether multiple spaced relay contacts, 56 and 58, are to be provided, and will further depend on the size of the relay contacts, 56 and 58, which is related to a current-carrying capacity of the latching relay 10.

In FIG. 9n, a pair of upper electrodes 24 are formed for activating the latching relay 10. The upper electrodes 24 can be formed as described heretofore with reference to FIG. 2i. In this example of the present invention, one of the upper electrodes 24 is patterned to provide a region wherein an electrical interconnection 64 can be formed to electrically contact the upper relay contact 58. The electrical interconnection 64, which is preferably aligned along the longitudinal axis of the membrane 14 as shown in the cross-sectional view of FIG. 9n, can be formed by the same process steps used for forming the upper electrodes 24. In some embodiments of the present invention, the electrical interconnection 64 or an electrically-conducting membrane 14 can form the upper relay contact 58. In other embodiments of the present invention an upper relay contact 58 can be provided, with electrical interconnect wiring formed on the insulating layer 22 being substituted for the lower relay contact 56.

After formation of the upper electrodes 24 and the electrical interconnection 64, the membrane 14 can be released by etching away the second sacrificial layer 32 between the supports 16 as described heretofore. After the etch release step, the membrane 14 assumes one of two mechanical states defined by a curvilinear (e.g. sinusoidal) cross-sectional shape of the membrane 14 as shown in FIGS. 8a and 8b due to the compressive stress in the material forming the membrane 14.

In FIG. 8a, the SPST latching relay 10 is shown in a first mechanical state wherein the relay contacts, 56 and 58, are open circuit (i.e. in an open-circuit state). The application of a programming voltage of a predetermined magnitude between the lower electrode 20 and the upper electrode 24 (which is formed about the upper relay contact 58 and the electrical interconnection 64) generates an electrostatic force of attraction between the electrodes, 20 and 24, that switches the latching relay 10 from the first mechanical state to a second mechanical state (i.e. a closed-circuit state) wherein the upper relay contact 58 is electrically connected to the lower relay contact 56, allowing a flow of an electrical signal therebetween. The relay contacts, 56 and 58, are preferably dimensioned to provide a total height thereof that is slightly greater than a vertical distance between the membrane 14 and the insulating layer 22 in FIG. 8b so that the membrane 14 provides a small positive force to close the relay contacts, 56 and 58. Upon removing the programming voltage, the relay 10 in FIG. 8b is latched by the mechanical state of the membrane 14 so that the relay contacts, 56 and 58, remain closed (i.e. in the closed-circuit state). The relay 10 can be reset to the open-circuit state by applying a programming voltage between the lower electrode 20 and the other upper electrode 24 that was not initially activated.

The latching relay device 10 disclosed herein has applications for switching or for routing direct current (dc) or at a radio frequency (rf) electrical signals. The latching relay device 10 is particularly useful for switching or routing electrical signals at frequencies in the GHz range wherein present silicon-based integrated circuit digital switches are inoperable. Thus, according to some embodiments of the present invention, a plurality of latching relay devices 10 can be formed on a silicon substrate 12 with integrated circuitry being formed on the substrate 12 for providing the programming voltage, V, and addressing circuitry 110 for operating each device 10.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A microelectromechanical (MEM) actuator, comprising:
   (a) a shaped membrane formed above a substrate, the membrane being held in compression by elongate supports attached to a pair of opposing edges of the membrane and by an elongate resilient member attached to the membrane at a midpoint thereof to provide a curvilinear cross-sectional shape for the membrane and thereby define a first mechanical state of the membrane; and
   (b) electrostatic means for switching the membrane from the first mechanical state to a second mechanical state having a cross-sectional shape that is a mirror image the first mechanical state.

2. The MEM actuator of claim 1 wherein the substrate comprises silicon.

3. The MEM actuator of claim 1 wherein the membrane comprises a material selected from the group consisting of polysilicon, silicon nitride, silicon dioxide, metals and metal alloys.

4. The MEM actuator of claim 1 wherein the membrane has a rectangular shape in plan view.

5. The MEM actuator of claim 1 wherein the electrostatic means for switching the membrane comprises at least one electrode formed on or within the membrane, and an opposing electrode formed proximate to the substrate.

6. The MEM actuator of claim 1 wherein the electrostatic means for switching the membrane comprises at least one pair of spaced electrodes forming an air-gap capacitor, and a programming voltage applied between the pair of spaced electrodes to generate an electrostatic force of attraction therebetween.

7. The MEM actuator of claim 6 wherein each mechanical state of the actuator is stable in the absence of the programming voltage.

8. The MEM actuator of claim 6 wherein the programming voltage is provided by an electrical signal generator.

9. The MEM actuator of claim 8 wherein the electrical signal generator is formed as an integrated circuit on the substrate proximate to the membrane.

10. The MEM actuator of claim 8 further including addressing circuitry connected between the electrical signal generator and the spaced electrodes to provide the programming voltage to a predetermined pair of the spaced electrodes.

11. The MEM actuator of claim 10 wherein the addressing circuitry is formed on the substrate proximate to the membrane.

12. The MEM actuator of claim 1 further including a mirror supported on a post and centered above the membrane, with the mirror being switchable between a pair of angular states in response to the mechanical states of the actuator being switched, thereby deflecting an incident light beam.

13. The MEM actuator of claim 12 wherein the mirror includes a reflective coating.

14. The MEM actuator of claim 12 wherein the electrostatic means for switching the membrane comprises at least one pair of spaced electrodes forming an air-gap capacitor, and a programming voltage applied between the pair of spaced electrodes to generate an electrostatic force of attraction therebetween.

15. The MEM actuator of claim 14 wherein each angular state of the actuator is stable in the absence of the programming voltage.

16. The MEM actuator of claim 1 further including a pair of mirrors supported above the membrane, with each mirror being located substantially halfway between the resilient member and one of the opposing edges of the membrane, the pair of mirrors being moveable in opposing vertical directions in response to switching of the mechanical states of the actuator, thereby modulating an incident light beam.

17. The MEM actuator of claim 16 wherein the mirror includes a reflective coating.

18. The MEM actuator of claim 16 wherein the pair of mirrors are coplanar in the first mechanical state and non-coplanar in the second mechanical state.

19. The MEM actuator of claim 18 wherein each mechanical state of the actuator is stable until activation thereof by the electrostatic means for switching the membrane.

20. The MEM actuator of claim 1 further including a first relay contact formed on the membrane and a second relay contact formed proximate to the membrane, the first and second relay contacts forming an electrical closed circuit in one mechanical state of the membrane, and forming an electrical open circuit in the other mechanical state of the membrane.

21. The MEM actuator of claim 20 wherein the second relay contact is formed below the membrane and in electrical contact therewith.

22. The MEM actuator of claim 20 wherein each mechanical state of the actuator is latched until activation thereof by the electrostatic means for switching the membrane.

23. A bistable microelectromechanical (MEM) actuator comprising:

(a) a substrate;

(b) a stressed membrane formed above the substrate, the membrane being supported at a pair of opposing edges thereof and further being supported by a resilient member below the membrane near a midpoint thereof to provide a curvilinear cross-sectional shape for the membrane to define a first mechanical state thereof; and (c) electrostatic means for switching the stressed membrane from the first mechanical state to a second mechanical state having a cross-sectional shape that is a mirror image of the first mechanical state.

24. The MEM actuator of claim 23 wherein the substrate comprises silicon, and the membrane comprises a material selected from the group consisting of polysilicon, silicon nitride, silicon dioxide, metals and metal alloys.

25. The MEM actuator of claim 23 wherein the substrate includes a cavity wherein the resilient member is located.

26. The MEM actuator of claim 23 wherein the electrostatic means for switching the membrane comprises at least one electrode formed in contact with the membrane and another electrode spaced at a distance therefrom.

27. The MEM actuator of claim 26 wherein the electrostatic means further includes addressing circuitry for providing a programming voltage to the electrodes to actuate the MEM actuator.

28. The MEM actuator of claim 27 wherein the programming voltage is provided by an electrical signal generator.

29. The MEM actuator of claim 27 wherein the programming voltage is provided by or controlled by a computer.

30. The MEM actuator of claim 29 in the form of a switchable mirror device.

31. The MEM actuator of claim 30 wherein the moveable mirrors are held stationary in the absence of the programming voltage applied to the actuator.

32. The MEM actuator of claim 30 in the form of an optical modulator.

33. The MEM actuator of claim 32 wherein a first electrical contact is formed on the membrane and a second electrical contact is formed superposed with the first electrical contact.

34. The MEM actuator of claim 23 further including a mirror supported above the membrane, with the mirror being rotatable in response to switching of the membrane, thereby deflecting an incident light beam.

35. The MEM actuator of claim 34 wherein the incident light beam is deflected between a pair of angular states.

36. The MEM actuator of claim 35 wherein each angular state is stable in the absence of a programming voltage applied to the actuator.

37. The MEM actuator of claim 23 further including a pair of mirrors supported above the membrane, with each mirror being located substantially halfway between the resilient member and one of the supported edges of the membrane, the pair of mirrors being synchronously moveable in response to switching the stressed membrane, thereby modulating an incident light beam.

38. The MEM actuator of claim 37 wherein the pair of mirrors are substantially coplanar in one of the mechanical states and non-coplanar in another of the mechanical states.

39. The MEM actuator of claim 23 further including at least one electrical contact moveable by the membrane to provide in one mechanical state of the membrane an electrical closed circuit, and to provide in another mechanical state of the membrane an electrical open circuit.

40. The MEM actuator of claim 39 wherein the electrical open circuit or closed circuit is maintained until the application of a programming voltage to the MEM actuator.

41. The MEM actuator of claim 39 in the form of a latching relay.

42. A method for forming a microelectromechanical (MEM) actuator, comprising steps for:

(a) forming a resilient member and a pair of elongate supports on a substrate;

(b) forming a stressed membrane having a curvilinear shape by attaching the membrane at a midpoint thereof to the resilient member and at a pair of opposing edges thereof to the elongate supports; and (c) forming a first electrode on or within the stressed membrane, and forming a second electrode spaced therefrom for electrostatically switching the membrane between a pair of mechanical states thereof.

43. The method of claim 42 wherein the step for forming the resilient member and elongate supports comprises steps for:

(a) forming an insulating layer on the substrate;

(b) depositing a sacrificial layer on the insulating layer;

(c) etching the sacrificial layer and forming a plurality of sidewalls therein;

(d) depositing a resilient-member-forming layer on the sacrificial layer and sidewalls; and (e) anisotropically etching the resilient-member-forming layer to remove the resilient-member-forming layer except on the sidewalls, thereby forming the resilient member and elongate supports.

44. The method of claim 42 wherein the step for forming the stressed membrane comprises steps for:

(a) depositing a sacrificial layer above the substrate and filling in a region between the resilient member and elongate supports;

(b) depositing the stressed membrane above the sacrificial layer; and (c) releasing the stressed membrane by etching away the sacrificial layer.

45. The method of claim 42 further including steps for forming at least one mirror supported above the membrane.

* * * * *